(12) United States Patent
Okamoto

(10) Patent No.: US 9,923,049 B2
(45) Date of Patent: Mar. 20, 2018

(54) COMPOUND SEMICONDUCTOR DEVICE AND METHOD FOR MANUFACTURING THE SAME

(71) Applicant: FUJITSU LIMITED, Kawasaki-shi, Kanagawa (JP)

(72) Inventor: Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 2 days.

(21) Appl. No.: 14/988,894

(22) Filed: Jan. 6, 2016

(65) Prior Publication Data

US 2016/0218201 A1  Jul. 28, 2016

(30) Foreign Application Priority Data

Jan. 22, 2015  (JP) ................. 2015-010723

(51) Int. Cl.
  *H01L 29/04* (2006.01)
  *H01L 29/205* (2006.01)
  (Continued)

(52) U.S. Cl.
  CPC ...... *H01L 29/045* (2013.01); *H01L 21/02609* (2013.01); *H01L 21/8252* (2013.01);
  (Continued)

(58) Field of Classification Search
  CPC ................ H01L 29/045; H01L 29/205; H01L 29/66219; H01L 29/882; H01L 27/0605;
  (Continued)

(56) References Cited

U.S. PATENT DOCUMENTS 9,111,786 B1* 8/2015 Kub .................. H01L 29/66462
2005/0121696 A1  6/2005 Nakazawa et al.
  (Continued)

FOREIGN PATENT DOCUMENTS

JP  2005-79417   3/2005
JP  2014-63917   4/2014

OTHER PUBLICATIONS

S. Sakr, et al., "Ballistic transport in GaN/AlGaN resonant tunneling diodes", Journal of Applied Physics, 109, 023717 (2011), (7 pages).
  (Continued)

*Primary Examiner* — Yu Chen
(74) *Attorney, Agent, or Firm* — Fujitsu Patent Center

(57) ABSTRACT

A compound semiconductor device includes: a substrate; a first barrier layer of a nitride semiconductor formed over the substrate; a well layer of a nitride semiconductor formed over the first barrier layer; and a second barrier layer of a nitride semiconductor formed over the well layer, wherein the first barrier layer, the well layer, and the second barrier layer each include a first region having, as an upper surface, a (0001) plane in terms of crystal orientation and a second region having, as an upper surface, a (000-1) plane in terms of crystal orientation, the first region of the first barrier layer, the first region of the well layer, and the first region of the second barrier layer are stacked, the second region of the first barrier layer, the second region of the well layer, and the second region of the second barrier layer are stacked.

7 Claims, 19 Drawing Sheets

(51) Int. Cl.
*H01L 29/88* (2006.01)
*H01L 29/778* (2006.01)
*H01L 21/8252* (2006.01)
*H01L 27/06* (2006.01)
*H01L 29/66* (2006.01)
*H01L 29/06* (2006.01)
*H01L 29/15* (2006.01)
*H01L 21/02* (2006.01)
*H01L 23/31* (2006.01)
*H01L 29/43* (2006.01)
*H01L 29/20* (2006.01)

(52) U.S. Cl.
CPC ...... *H01L 27/0605* (2013.01); *H01L 27/0629* (2013.01); *H01L 29/0649* (2013.01); *H01L 29/205* (2013.01); *H01L 29/66219* (2013.01); *H01L 29/7786* (2013.01); *H01L 29/882* (2013.01); *H01L 21/0254* (2013.01); *H01L 21/02458* (2013.01); *H01L 23/3171* (2013.01); *H01L 27/0623* (2013.01); *H01L 29/155* (2013.01); *H01L 29/2003* (2013.01); *H01L 29/432* (2013.01); *H01L 2924/0002* (2013.01)

(58) Field of Classification Search
CPC ..... H01L 33/0025; H01L 33/06; H01L 33/08; H01L 33/16; H01L 33/18; H01L 33/32; H01L 21/02516; H01L 21/02609; H01L 21/02433; H01L 21/02458; H01L 21/0254; H01L 21/2036; H01L 29/155
See application file for complete search history.

(56) References Cited

U.S. PATENT DOCUMENTS

| | | | |
|---|---|---|---|
| 2010/0072485 A1* | 3/2010 | Suda | B82Y 20/00 257/77 |
| 2011/0020602 A1* | 1/2011 | Schlesser | C30B 25/02 428/141 |
| 2013/0214287 A1* | 8/2013 | Okamoto | H01L 21/8252 257/76 |
| 2013/0292683 A1* | 11/2013 | Shah | H01L 29/93 257/76 |
| 2014/0084344 A1 | 3/2014 | Zhu et al. | |

OTHER PUBLICATIONS

S.R. Lee et al., "In situ measurements of the critical thickness for strain relaxation in Al Ga N Ga N heterostructures", Applied Physics Letters, vol. 85, No. 25, pp. 6164-6166, Dec. 20, 2004 (4 pages).

M. Park et al., "Micro-Raman study of electric properties of invention domains in GaN-based lateral polarity heterostructures", Journal of Applied Physics, vol. 93, No. 12, pp. 9542-9547, Jun. 15, 2003 (7 pages).

M. H. Wong et al., "Polarity inversion of N-face GaN by plasma-assisted molecule beam epitaxy", Journal of Applied Physics, 104, 093710, (2008) (7 pages).

* cited by examiner

COMPOUND SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2015-010723, filed on Jan. 22, 2015, the entire contents of which are incorporated herein by reference.

FIELD

The embodiments discussed herein are related to a compound semiconductor device and a method for manufacturing the same.

BACKGROUND

Resonant-tunneling diodes (RTDs) having a GaAs/AlAs quantum well structure or an InGaAs/AlAs quantum well structure are quantum effect devices that have negative differential resistance characteristics, allow high-speed switching operation, and operate at room temperature. Multipliers, frequency dividers, sampling circuits, and multi-valued logic circuits using negative differential resistance characteristics have been developed. In particular, terahertz oscillators including RTDs have been increasingly developed in recent years, and application of RTDs to, for example, terahertz communication and image sensors is expected.

Recent studies have also focused on RTDs having a GaN/AlGaN quantum well structure (hereinafter may be referred to as GaN-based RTDs) that may be integrated with GaN-based high-electron mobility transistors (HEMTs).

However, GaN-based RTDs exhibit asymmetric I-V characteristics due to an internal field generated by polarization that is characteristic of GaN. Even if the Fermi level is aligned with the quantum level as a result of the raising of the conduction band on an emitter side, electron tunneling is difficult. Thus, a high-speed logic gate monostable-bistable transition logic element (MOBILE) circuit integrating a GaN-based RTD and a GaN-based HEMT fails to have good I-V characteristics.

Although various studies have been conducted to obtain symmetric I-V characteristics of GaN-based RTDs, GaN-based RTDs that may be integrated with GaN-based HEMTs to provide good I-V characteristics have not been obtained.

The following documents are reference documents.
[Document 1] Japanese Laid-open Patent Publication No. 2014-63917,
[Document 2] Japanese Laid-open Patent Publication No. 2005-79417,
[Document 3] Sakr et al., "*Ballistic transport in GaN/AlGaN resonant tunneling Diodes*", Journal of Applied Physics, 109, 023717 (2011),
[Document 4] Lee et al., "*In situ measurements of the critical thickness for strain relaxation in AlGaN GaN heterostructures*", Applied Physics letters, 85, 6164 (2004),
[Document 5] M. Park et al., "*Micro-Raman study of electric properties of invention domains in GaN-based lateral polarity heterostructures*", Journal of Applied Physics, Volume 93, Number 12, 15 Jun. 2003, and
[Document 6] M. H. Wong et al., "*Polarity inversion of N-face GaN by plasma-assisted molecule beam epitaxy*", Journal of Applied Physics, 104, 093710 (2008).

SUMMARY

According to an aspect of the invention, a compound semiconductor device includes: a substrate; a first barrier layer of a nitride semiconductor formed over the substrate; a well layer of a nitride semiconductor formed over the first barrier layer; and a second barrier layer of a nitride semiconductor formed over the well layer, wherein the first barrier layer, the well layer, and the second barrier layer each include a first region having, as an upper surface, a (0001) plane in terms of crystal orientation and a second region having, as an upper surface, a (000-1) plane in terms of crystal orientation, the first region of the first barrier layer, the first region of the well layer, and the first region of the second barrier layer are stacked in a thickness direction of the substrate, the second region of the first barrier layer, the second region of the well layer, and the second region of the second barrier layer are stacked in a thickness direction of the substrate, a first emitter electrode and a first collector electrode are formed over or adjacent to a part in which the first regions are stacked, a second emitter electrode and a second collector electrode are formed over or adjacent to a part in which the second regions are stacked, the first emitter electrode and the second emitter electrode are electrically coupled to each other, and the first collector electrode and the second collector electrode are electrically coupled to each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Detailed description of embodiments is given below with reference to the accompanying drawings.

First Embodiment

Figure 1A:
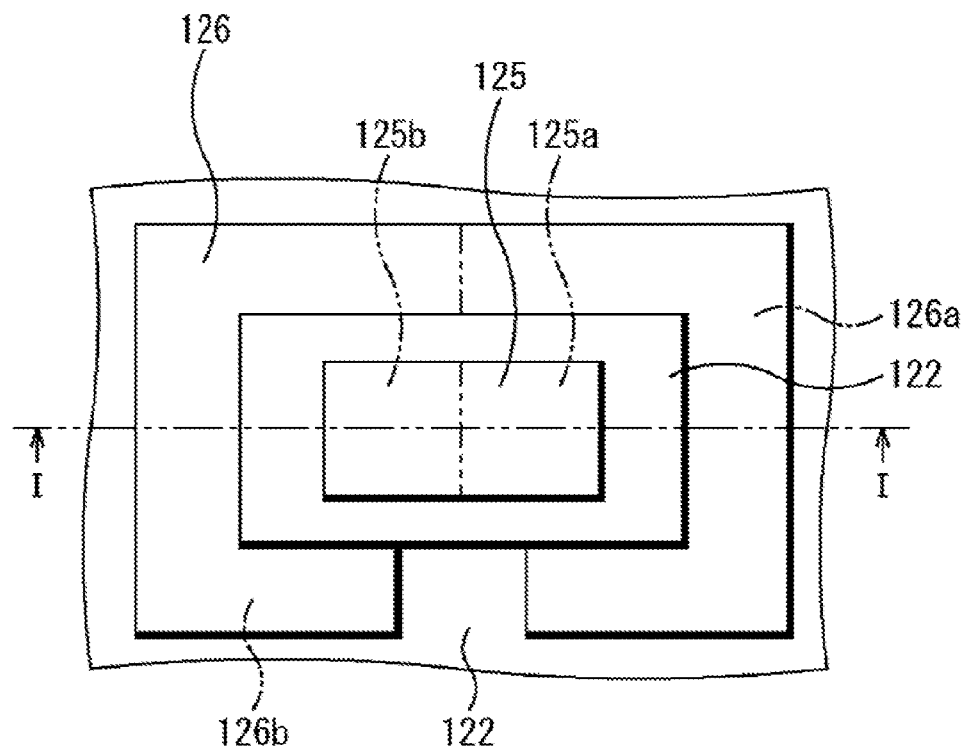
FIGS. 1A and 1B are views illustrating the configuration of a compound semiconductor device according to a first embodiment.
Figure 1B:
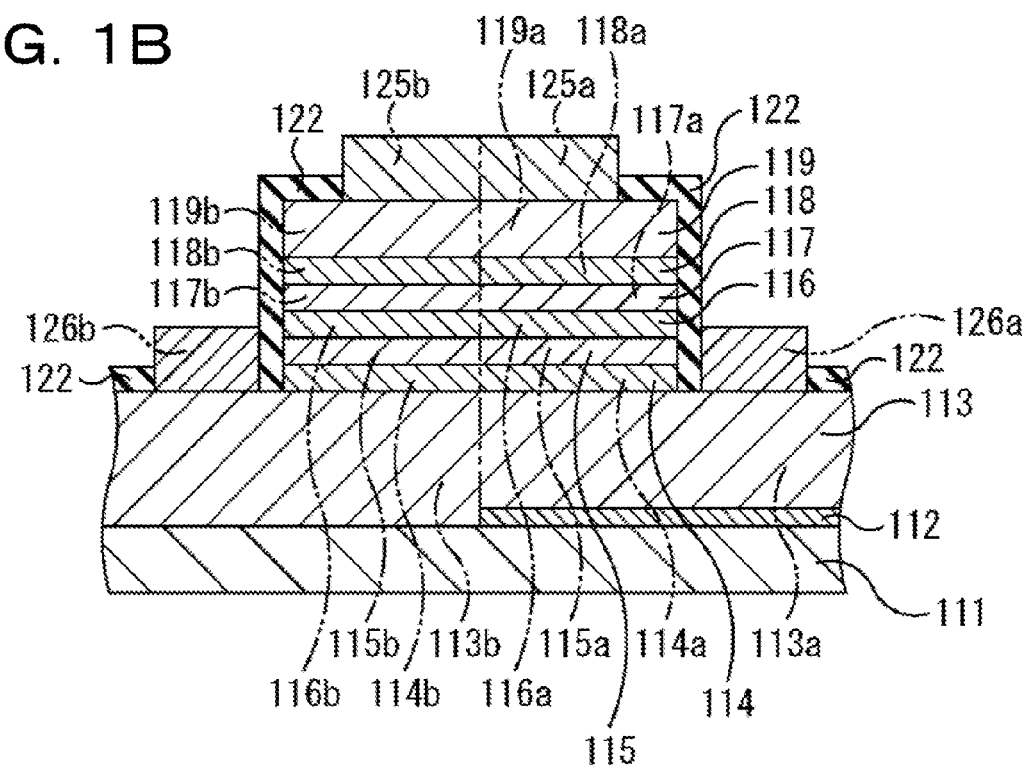

First, a first embodiment is described. The first embodiment is related to a compound semiconductor device including a resonant-tunneling diode (RTD). FIGS. 1A and 1B are views illustrating the configuration of the compound semiconductor device according to the first embodiment. FIG. 1A is a plan view and FIG. 1B is a cross-sectional view along a line I-I in FIG. 1A.

In the compound semiconductor device according to the first embodiment, as illustrated in FIGS. 1A and 1B, a nucleation layer 112 is selectively formed on a substrate 111, and a collector contact layer 113 is formed on the nucleation layer 112 and the substrate 111. The collector contact layer 113 includes a first region 113a having a lower surface in contact with the upper surface of the nucleation layer 112 and a second region 113b having a lower surface in contact with the upper surface of the substrate 111. For example, the substrate 111 is a sapphire substrate having a c-plane as an upper surface, the nucleation layer 112 is an AlN layer, and the collector contact layer 113 is an n$^+$-GaN layer. The upper surface of the first region 113a is a Ga-polar surface, namely, a (0001) plane in terms of crystal orientation. The upper surface of the second region 113b is an N-polar surface, namely, a (000-1) plane in terms of crystal orientation.

On the collector contact layer 113, a spacer layer 114, a barrier layer 115, a well layer 116, a barrier layer 117, a spacer layer 118, and an emitter contact layer 119 are stacked in a mesa shape. For example, the spacer layers 114 and 118 are GaN layers without intentional impurity doping (i-GaN layers), the barrier layers 115 and 117 are AlN layers without intentional impurity doping (i-AlN layers), and the well layer 116 is a GaN layer without intentional impurity doping (i-GaN layer). The spacer layer 114 includes a first region 114a on the first region 113a and a second region 114b on the second region 113b. The barrier layer 115 includes a first region 115a on the first region 114a and a second region 115b on the second region 114b. The well layer 116 includes a first region 116a on the first region 115a and a second region 116b on the second region 115b. The barrier layer 117 includes a first region 117a on the first region 116a and a second region 117b on the second region 116b. The spacer layer 118 includes a first region 118a on the first region 117a and a second region 118b on the second region 117b. The emitter contact layer 119 includes a first region 119a on the first region 118a and a second region 119b on the second region 118b. The upper surfaces of the first regions 114a, 115a, 116a, 117a, 118a, and 119a are (0001) planes. The upper surfaces of the second regions 114b, 115b, 116b, 117b, 118b, and 119b are (000-1) planes.

An emitter electrode 125 is formed on the emitter contact layer 119, and a collector electrode 126 is formed on the collector contact layer 113. The emitter electrode 125 includes a first region 125a on the first region 119a and a second region 125b on the second region 119b. The collector electrode 126 includes a first region 126a on the first region 113a and a second region 126b on the second region 113b. The first region 125a and the second region 125b are integrated with and electrically coupled to each other. The first region 126a and the second region 126b are integrated with and electrically coupled to each other. The first region 125a is an example first emitter electrode, and the second region 125b is an example second emitter electrode. The first region 126a is an example first collector electrode, and the second region 126b is an example second emitter electrode.

A passivation film 122 is formed to cover portions of the collector contact layer 113, the spacer layer 114, the barrier layer 115, the well layer 116, the barrier layer 117, the spacer layer 118, and the emitter contact layer 119, the portions being exposed from the emitter electrode 125 or the collector electrode 126. The passivation film 122 is, for example, a silicon nitride film.

Figure 2A:
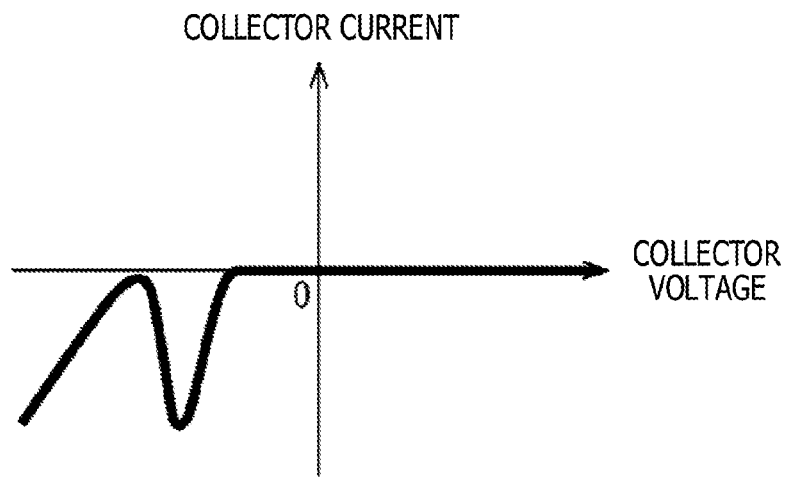
FIGS. 2A to 2C are graphs illustrating I-V characteristics.
Figure 2B:
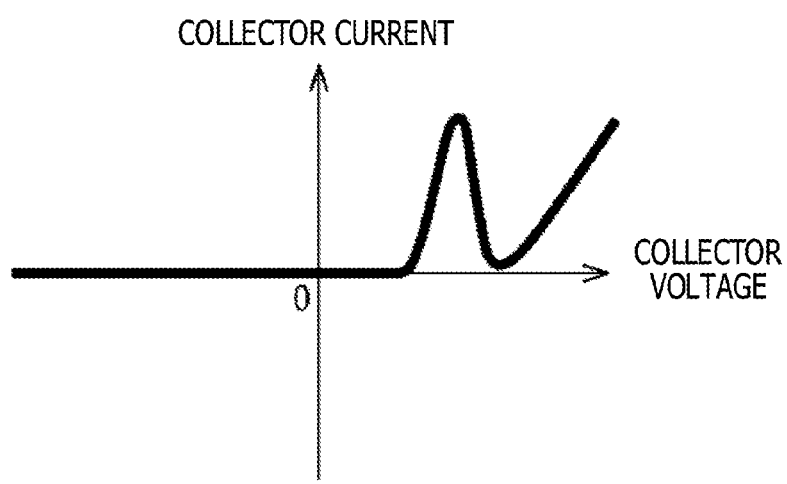
Figure 2C:
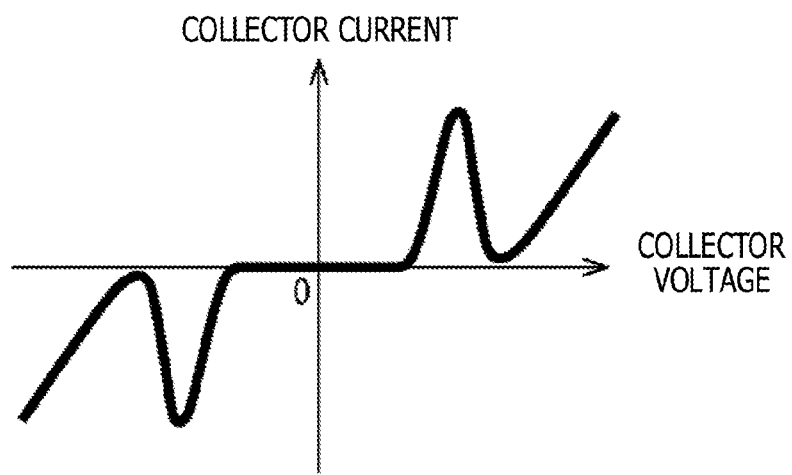

The compound semiconductor device according to the first embodiment includes a double-barrier quantum well structure having a (0001) plane as an upper surface and including the first regions 115a, 116a, and 117a and a double-barrier quantum well structure having a (000-1) plane as an upper surface and including the second regions 115b, 116b, and 117b. In these double-barrier quantum well structures, the conduction band potential becomes asymmetric and thus the I-V characteristics also become asymmetric due to an internal field associated with polarization. Since these double-barrier quantum well structures have an opposite direction of polarization, the I-V characteristics are rotationally symmetric. In other words, the I-V characteristics of the double-barrier quantum well structure having a (0001) plane as an upper surface are as depicted in FIG. 2A, whereas the I-V characteristics of the double-barrier quantum well structure having a (000-1) plane as an upper surface are as depicted in FIG. 2B. Therefore, the I-V characteristics of the first embodiment, which are obtained by addition of such I-V characteristics, are as depicted in FIG. 2C. That is, according to the first embodiment, I-V characteristics having good symmetry may be obtained. Since nitride semiconductors are used for the barrier layers 115 and 117 and the well layer 116, the conduction band discontinuity ΔEc may be increased compared with an RTD including a GaAs/AlAs quantum well structure or an InGaAs/AlAs quantum well structure. As a result, a large peak-to-valley ratio may be obtained.

Next, a method for manufacturing the compound semiconductor device according to the first embodiment is described. FIGS. 3A-3G are cross-sectional views sequentially illustrating the steps of a method for manufacturing the compound semiconductor device according to the first embodiment.

Figure 3A:
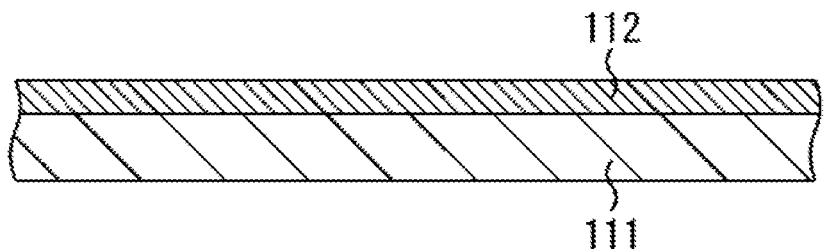
FIGS. 3A to 3G are cross-sectional views sequentially illustrating the steps of a method for manufacturing the compound semiconductor device according to the first embodiment.

First, as illustrated in FIG. 3A, a nucleation layer 112 is formed on a substrate 111. For example, a sapphire substrate having a c-plane as an upper surface is used as the substrate 111 and for example, an AlN layer having a thickness of 25 nm is formed as the nucleation layer 112 by a plasma-assisted molecular beam epitaxy (PAMBE) method. For example, the temperature of the substrate 111 is 720° C. when the nucleation layer 112 is formed.

Figure 3B:
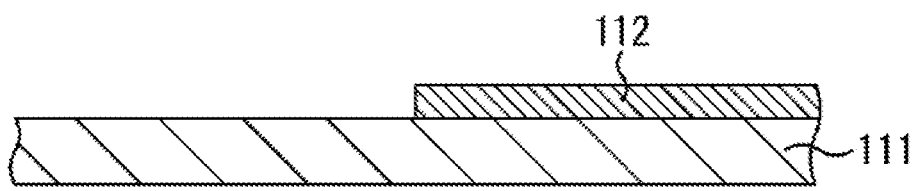

Next, as illustrated in FIG. 3B, a portion of the nucleation layer 112 is removed from a region in which a double-barrier quantum well structure having a (000-1) plane as an upper surface is to be formed. To remove the portion of the nucleation layer 112, a resist pattern that covers a region in which a double-barrier quantum well structure having a (0001) plane as an upper surface is to be formed is formed, and wet etching using KOH, chlorine-based dry etching, argon-ion milling, or the like is performed by using this resist pattern as a mask. The resist pattern is then removed.

Figure 3C:
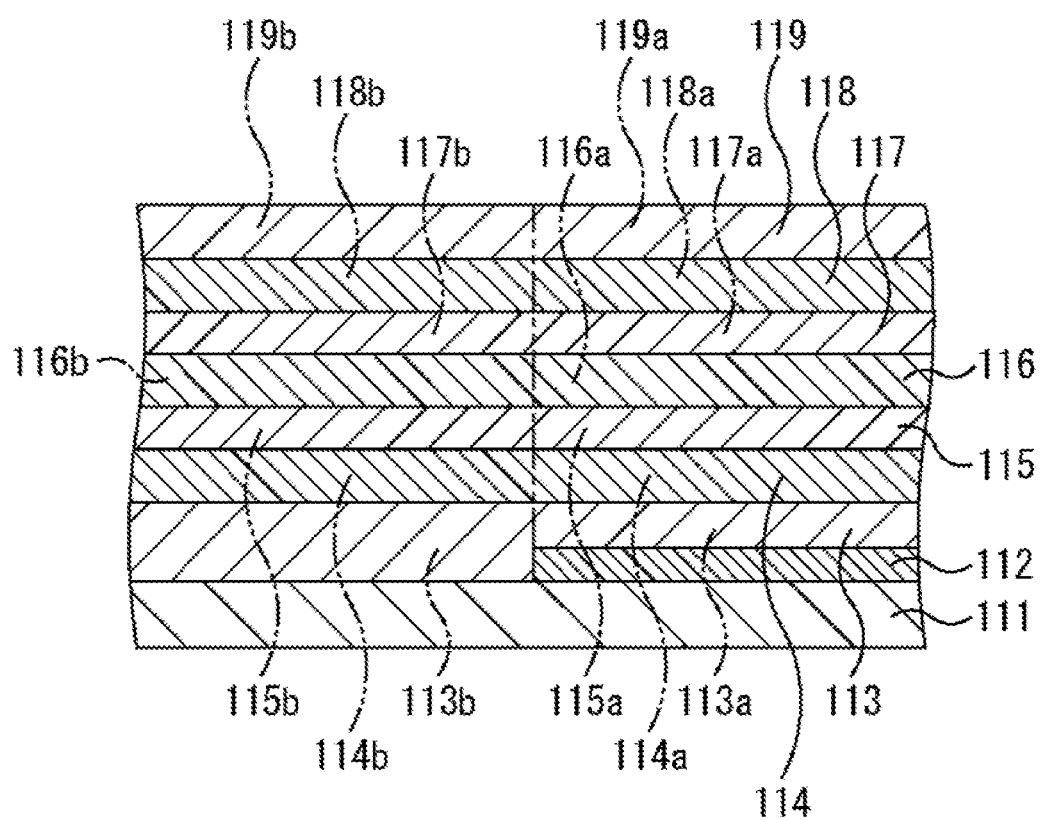

Thereafter, as illustrated in FIG. 3C, on the substrate 111 and the nucleation layer 112, a collector contact layer 113, a spacer layer 114, a barrier layer 115, a well layer 116, a barrier layer 117, a spacer layer 118, and an emitter contact layer 119 are formed. The collector contact layer 113, the spacer layer 114, the barrier layer 115, the well layer 116, the barrier layer 117, the spacer layer 118, and the emitter contact layer 119 may be formed by, for example, a PAMBE method with a temperature of the substrate 111 of 720° C. As the collector contact layer 113, for example, an $n^+$-GaN layer having a thickness of 1 μm is formed. As the spacer layer 114, for example, an i-GaN layer having a thickness of 10 nm is formed. As the barrier layer 115, for example, an i-AlN layer having a thickness of 1 nm is formed. As the well layer 116, for example, an i-GaN layer having a thickness of 5 nm is formed. As the barrier layer 117, for example, an i-AlN layer having a thickness of 1 nm is formed. As the spacer layer 118, for example, an i-GaN layer having a thickness of 10 nm is formed. As the emitter contact layer 119, for example, an $n^+$-GaN layer having a thickness of 100 nm is formed. In the case where a GaN layer is grown on a sapphire substrate having a c-plane as an upper surface by a PAMBE method, the upper surface of the GaN layer has Ga-polarity if an AlN nucleation layer is formed in advance and has N-polarity if the GaN layer is grown directly on the sapphire substrate.

A region of the collector contact layer 113, the region being grown on the upper surface of the nucleation layer 112, is a first region 113a having a (0001) plane as an upper surface. A region of the collector contact layer 113, the region being grown on the upper surface of the substrate 111, is a second region 113b having a (000-1) plane as an upper surface. The spacer layer 114, the barrier layer 115, the well layer 116, the barrier layer 117, the spacer layer 118, and the emitter contact layer 119 include first regions 114a, 115a, 116a, 117a, 118a, and 119a grown on the first region 113a, respectively. The spacer layer 114, the barrier layer 115, the well layer 116, the barrier layer 117, the spacer layer 118, and the emitter contact layer 119 include second regions 114b, 115b, 116b, 117b, 118b, and 119b grown on the second region 113b, respectively. In this way, the following structures are formed: a double-barrier quantum well structure having a (0001) plane as an upper surface and including the first regions 115a, 116a, and 117a; and a double-barrier quantum well structure having a (000-1) plane as an upper surface and including the second regions 115b, 116b, and 117b.

Figure 3D:
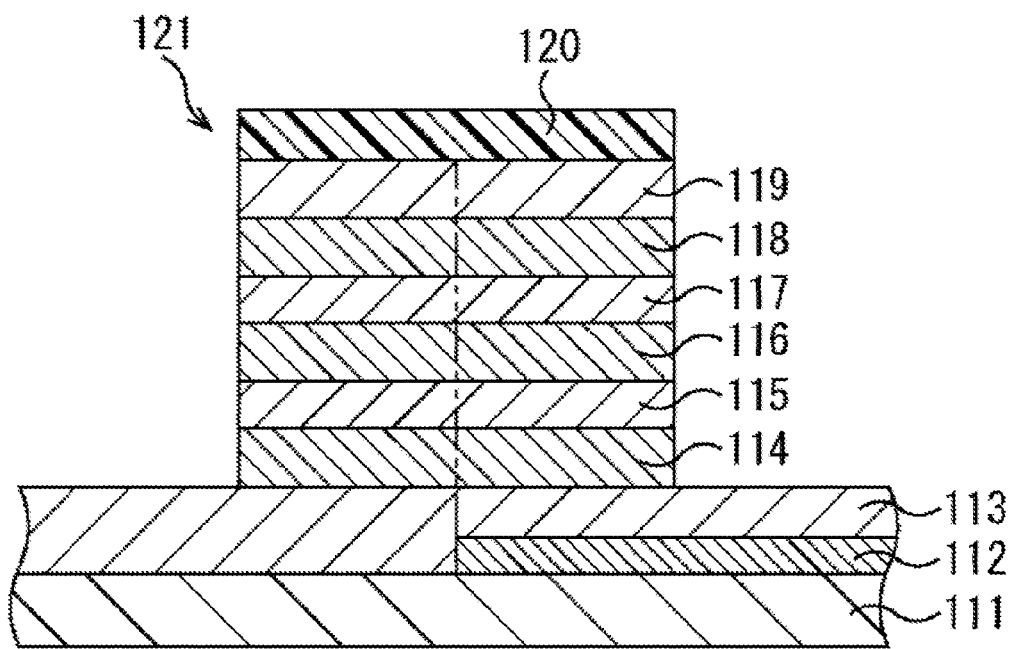

Subsequently, as illustrated in FIG. 3D, a resist pattern 120 that covers portions of the first regions 114a-119a and portions of the second regions 114b-119b is formed on the emitter contact layer 119, and dry etching is performed using the resist pattern 120 as a mask to expose the upper surface of the collector contact layer 113. As a result, a mesa structure 121 including the spacer layer 114, the barrier layer 115, the well layer 116, the barrier layer 117, the spacer layer 118, and the emitter contact layer 119 is formed. Next, the resist pattern 120 is removed.

Figure 3E:
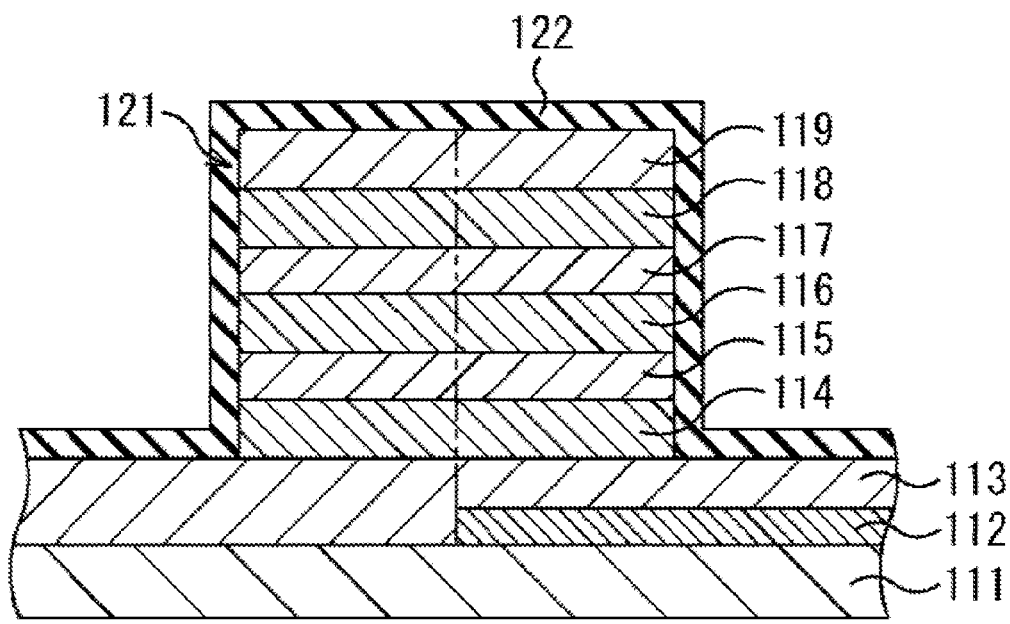

Thereafter, as illustrated in FIG. 3E, a passivation film 122 that covers exposed surfaces of the mesa structure 121 and the collector contact layer 113 is formed. As the passivation film 122, for example, a silicon nitride film is formed by, for example, a plasma chemical vapor deposition (CVD) method.

Figure 3F:
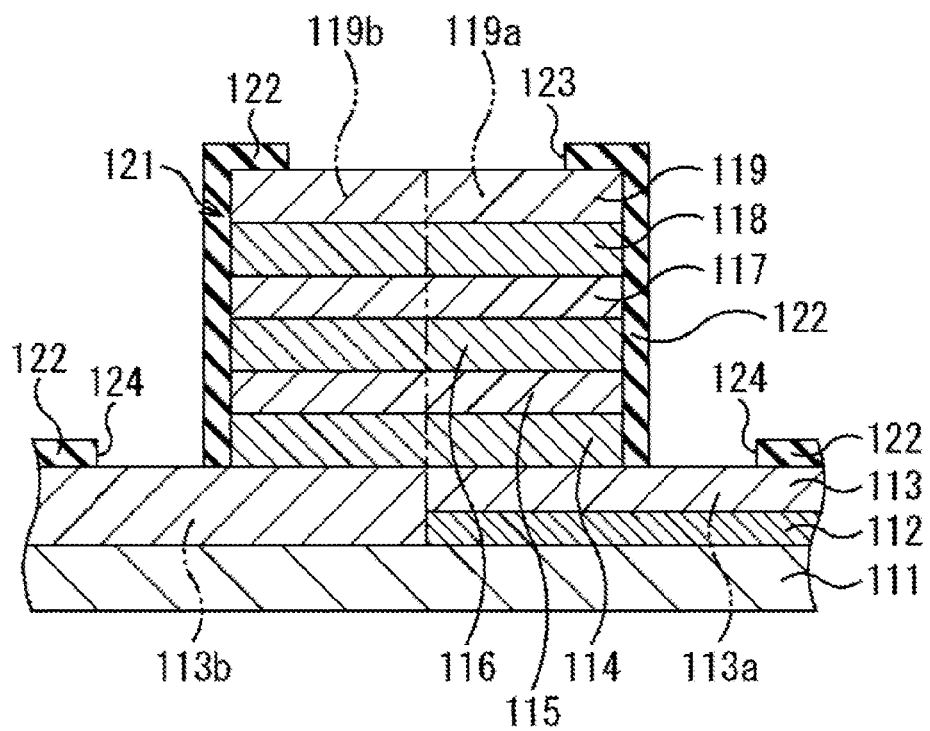

Subsequently, as illustrated in FIG. 3F, an opening 123 is formed in a region of the passivation film 122 in which an emitter electrode is to be formed. An opening 124 is formed in a region of the passivation film 122 in which a collector electrode is to be formed. The opening 123 is formed to expose both the first region 119a and the second region 119b. The opening 124 is formed to expose both the first region 113a and the second region 113b. To form the openings 123 and 124, for example, dry etching using a resist pattern is performed.

Figure 3G:
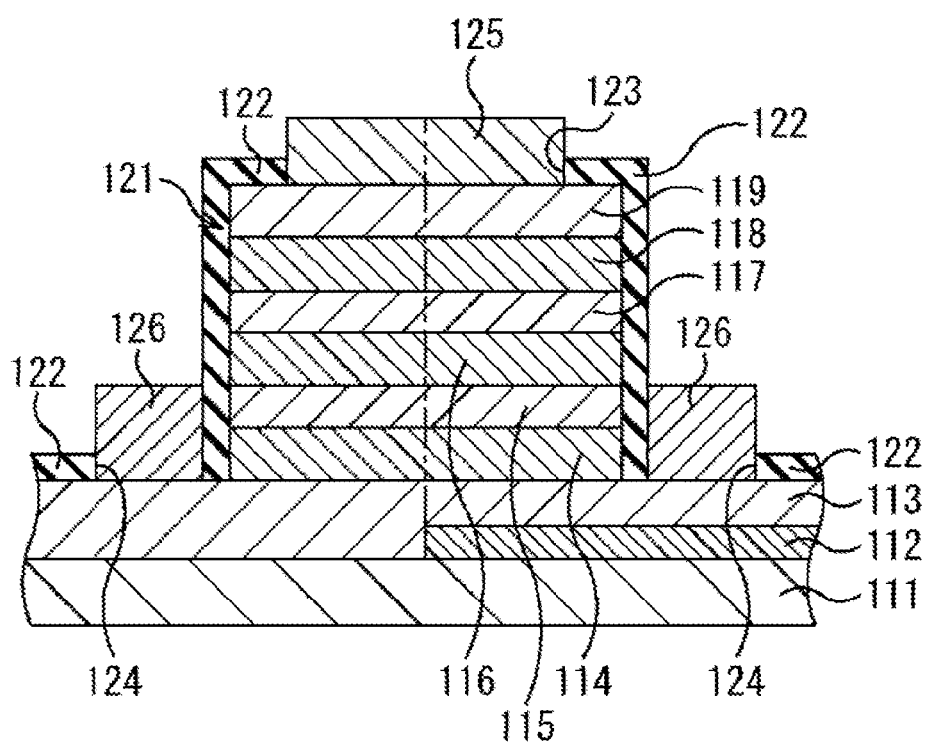

Next, as illustrated in FIG. 3G, an emitter electrode 125 is formed in the opening 123, and a collector electrode 126 is formed in the opening 124. The emitter electrode 125 is formed in contact with both the first region 119a and the second region 119b. The collector electrode 126 is formed in contact with both the first region 113a and the second region 113b. The formation of the emitter electrode 125 and the collector electrode 126 involves, for example, forming a resist pattern for exposing regions in which the emitter electrode 125 and the collector electrode 126 are to be formed, forming a metal film by a vacuum evaporation method, and removing the resist pattern together with the metal film on the resist pattern. That is, a lift-off method allows portions of the metal film to respectively remain in the opening 123 and the opening 124. To form the metal film, for example, a Ti film is formed and an Al film is formed on the Ti film. After removal of the resist pattern, the metal film is brought into ohmic contact with the collector contact layer 113 or the emitter contact layer 119 by a heat treatment. As the heat treatment, for example, rapid thermal annealing (RTA) at about 600° C. is performed.

The compound semiconductor device according to the first embodiment may be produced accordingly.

The first regions and the second regions included in the spacer layer 114, the barrier layer 115, the well layer 116, the barrier layer 117, the spacer layer 118, the emitter contact layer 119, the emitter electrode 125, and the collector electrode 126 preferably have planes substantially line-symmetric to each other with respect to the boundary between the first regions and the second regions.

The first region 125a and the second region 125b may not be integrated with each other as long as the first region 125a and the second region 125b are electrically coupled to each other. The first region 126a and the second region 126b may not be integrated with each other as long as the first region 126a and the second region 126b are electrically coupled to each other.

Figure 4:
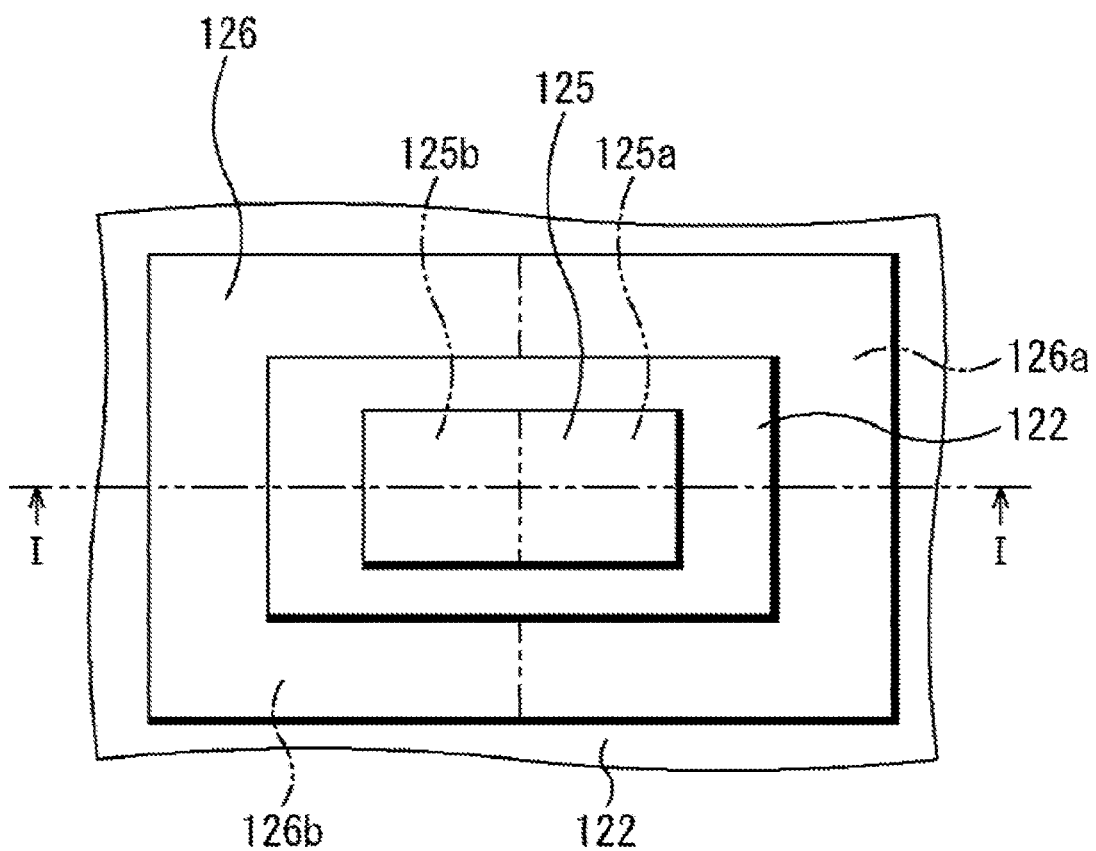
FIG. 4 is a view illustrating an example plane of a collector electrode.

The collector electrode 126 has a U-shaped plane in FIG. 1A. Alternatively, the collector electrode 126 may have a framed-rectangle plane as illustrated in FIG. 4. When the collector electrode 126 has a U-shaped plane, it is easy to remove a resist pattern in the formation of the emitter electrode 125 and the collector electrode 126.

Second Embodiment

Figure 5:
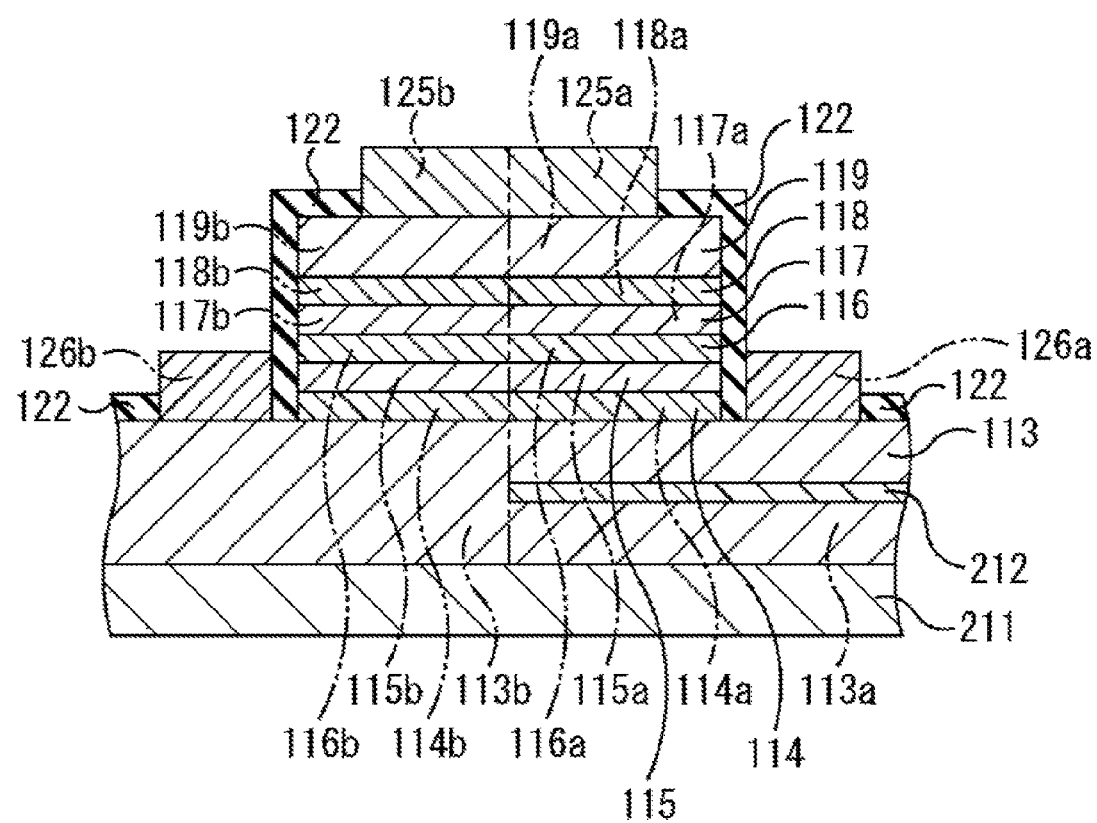
FIG. 5 is a cross-sectional view illustrating the configuration of a compound semiconductor device according to a second embodiment.

Next, a second embodiment is described. FIG. 5 is a cross-sectional view illustrating the configuration of a compound semiconductor device according to a second embodiment.

In the second embodiment, as illustrated in FIG. 5, a collector contact layer 113 is formed on a substrate 211, and a Mg layer 212 is selectively formed in the collector contact layer 113. The collector contact layer 113 includes a first region 113a including the Mg layer 212 in parallel with the substrate 211 and a second region 113b that does not include the Mg layer 212. For example, the substrate 211 is a SiC substrate (silicon carbide substrate) having, as an upper surface, a C (carbon) polar surface, namely, a (000-1) plane in terms of crystal orientation; a GaN substrate (gallium nitride substrate) having, an upper surface, an N-polar surface, namely, a (000-1) plane in terms of crystal orientation; or an AlN substrate (aluminum nitride substrate) having, an upper surface, an N-polar surface, namely, a (000-1) plane in terms of crystal orientation. The upper surface of the first region 113a is a Ga-polar surface, namely, a (0001) plane in terms of crystal orientation. The upper surface of the second region 113b is an N-polar surface, namely, a (000-1) plane in terms of crystal orientation. Other components are the same as those in the first embodiment.

According to the second embodiment, the same advantages as in the first embodiment may be obtained. The difference between the lattice constant of GaN and the lattice constant of SiC or AlN is smaller than the difference between the lattice constant of GaN and the lattice constant of sapphire. Therefore, when a SiC substrate or an AlN substrate is used as the substrate 211, lattice defects or the like may be reduced. When a GaN substrate is used as the substrate 211, lattice defects or the like may be further reduced.

In the production of the compound semiconductor device according to the second embodiment, for example, instead of the nucleation layer 112 in the method for manufacturing the compound semiconductor device according to the first embodiment, the Mg layer 212 is formed in the middle of the formation of the collector contact layer 113. It is known that, when a GaN layer is grown on a SiC substrate having a C-polar surface as an upper surface, the polarity of the upper surface of the GaN layer is inverted from N-polarity to Ga-polarity by deposition or emission of Mg in the middle of the growth.

Third Embodiment

Figure 6:
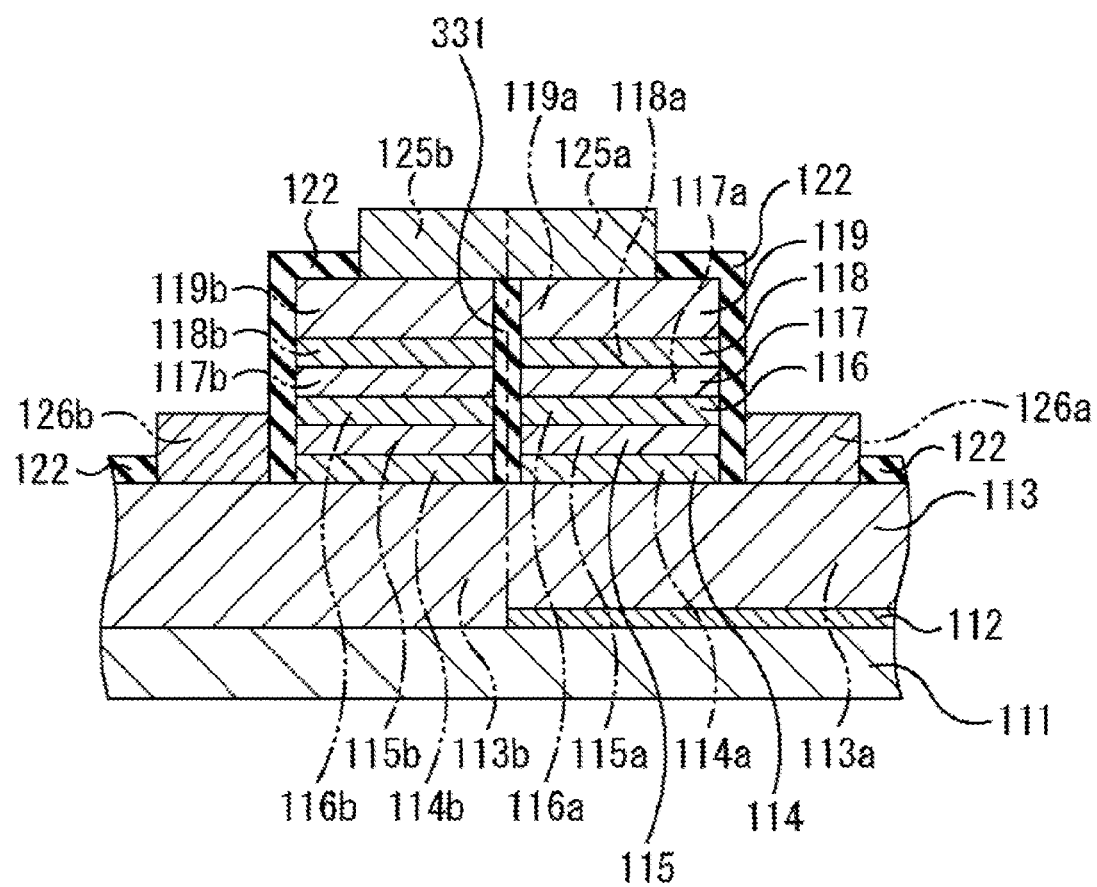
FIG. 6 is a cross-sectional view illustrating the configuration of a compound semiconductor device according to a third embodiment.

Next, a third embodiment is described. FIG. 6 is a cross-sectional view illustrating the configuration of a compound semiconductor device according to a third embodiment.

In the third embodiment, a passivation film 331 is formed in a spacer layer 114, a barrier layer 115, a well layer 116, a barrier layer 117, a spacer layer 118, and an emitter contact layer 119. The passivation film 331 separates a first region 114a and a second region 114b, separates a first region 115a and a second region 115b, separates a first region 116a and a second region 116b, and separates a first region 117a and a second region 117b. The passivation film 331 separates a first region 118a and a second region 118b and separates a first region 119a and a second region 119b. Other components are the same as those in the first embodiment.

According to the third embodiment, the same advantages as in the first embodiment may be obtained. In the third embodiment, there is no interface between the first region 114a and the second region 114b, no interface between the first region 115a and the second region 115b, no interface between the first region 116a and the second region 116b, no interface between the first region 117a and the second region 117b, no interface between the first region 118a and the second region 118b, or no interface between the first region 119a and the second region 119b. These interfaces may serve as leak paths. If a leak current is produced, the peak-to-valley ratio of I-V characteristics decreases. Therefore, according to the third embodiment, a better peak-to-valley ratio may be obtained.

In the production of the compound semiconductor device according to the third embodiment, for example, substantially the same process is performed as in the method for manufacturing the compound semiconductor device according to the first embodiment. Specifically, a region in which the passivation film 331 is to be formed is etched when a mesa structure 121 is formed, and the passivation film 331 is also formed when a passivation film 122 is formed.

Fourth Embodiment

Figure 7:
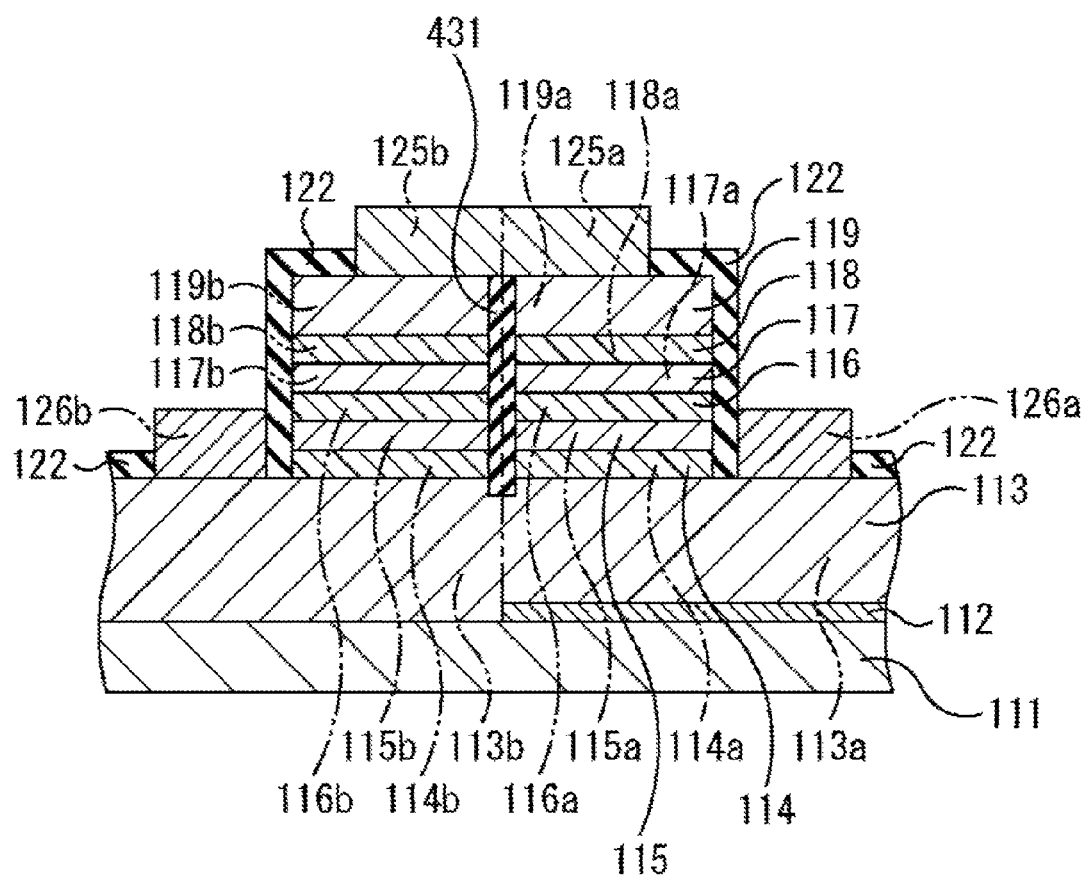
FIG. 7 is a cross-sectional view illustrating the configuration of a compound semiconductor device according to a fourth embodiment.

Next, a fourth embodiment is described. FIG. 7 is a cross-sectional view illustrating the configuration of a compound semiconductor device according to a fourth embodiment.

In the fourth embodiment, an ion-implanted region 431 is formed in a spacer layer 114, a barrier layer 115, a well layer 116, a barrier layer 117, a spacer layer 118, and an emitter contact layer 119. The ion-implanted region 431 separates a first region 114a and a second region 114b, separates a first region 115a and a second region 115b, separates a first region 116a and a second region 116b, and separates a first region 117a and a second region 117b. The passivation film 331 separates a first region 118a and a second region 118b and separates a first region 119a and a second region 119b. Other components are the same as those in the first embodiment.

According to the fourth embodiment, the same advantages as in the third embodiment may be obtained.

In the production of the compound semiconductor device according to the fourth embodiment, substantially the same process is performed as in the method for manufacturing the compound semiconductor device according to the first embodiment. Specifically, the ion-implanted region 431 is formed by ion implantation between the formation of the emitter contact layer 119 and the formation of the emitter electrode 125.

Fifth Embodiment

Figure 8A:
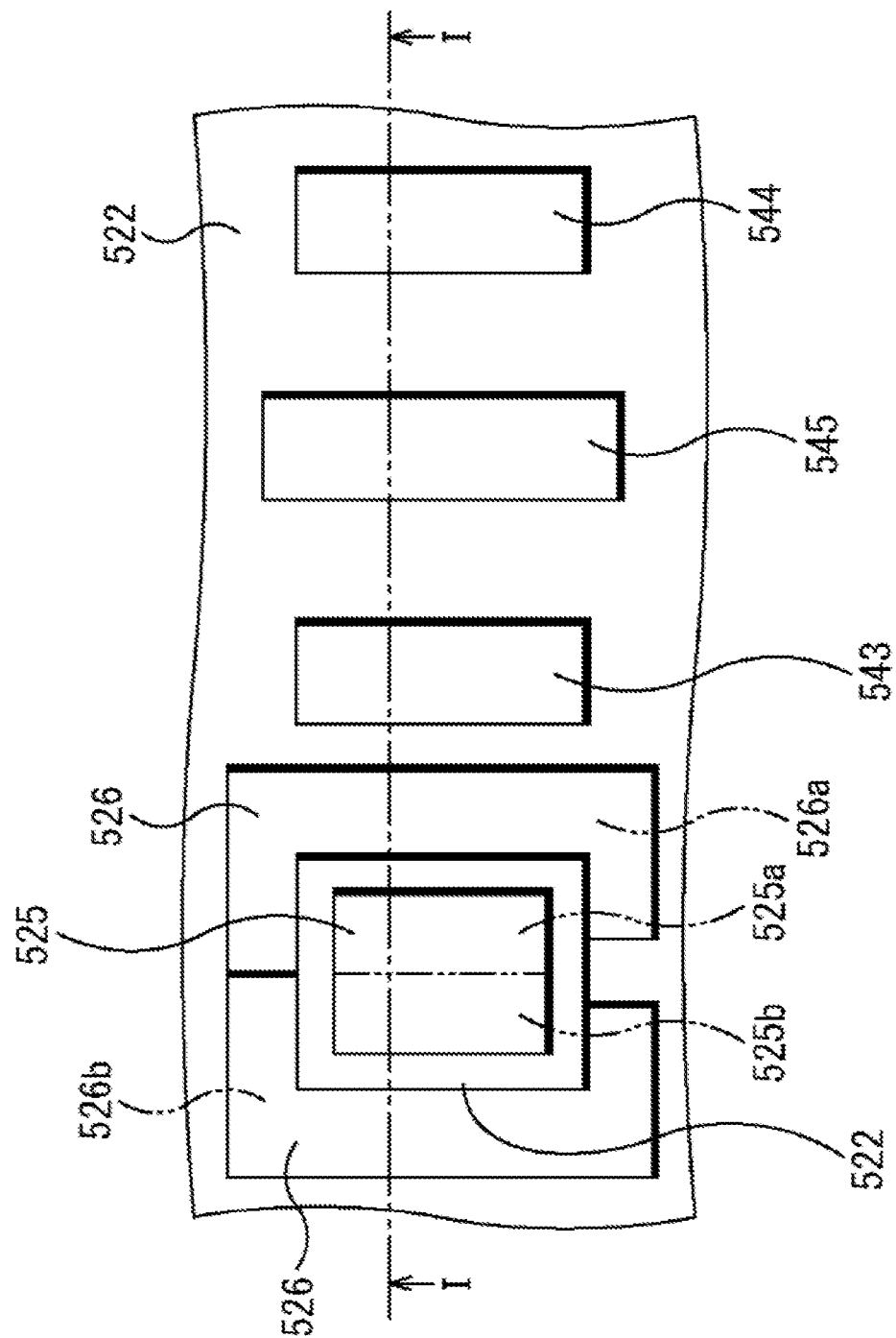
FIG. 8A is a plan view illustrating the configuration of a compound semiconductor device according to a fifth embodiment.
Figure 8B:
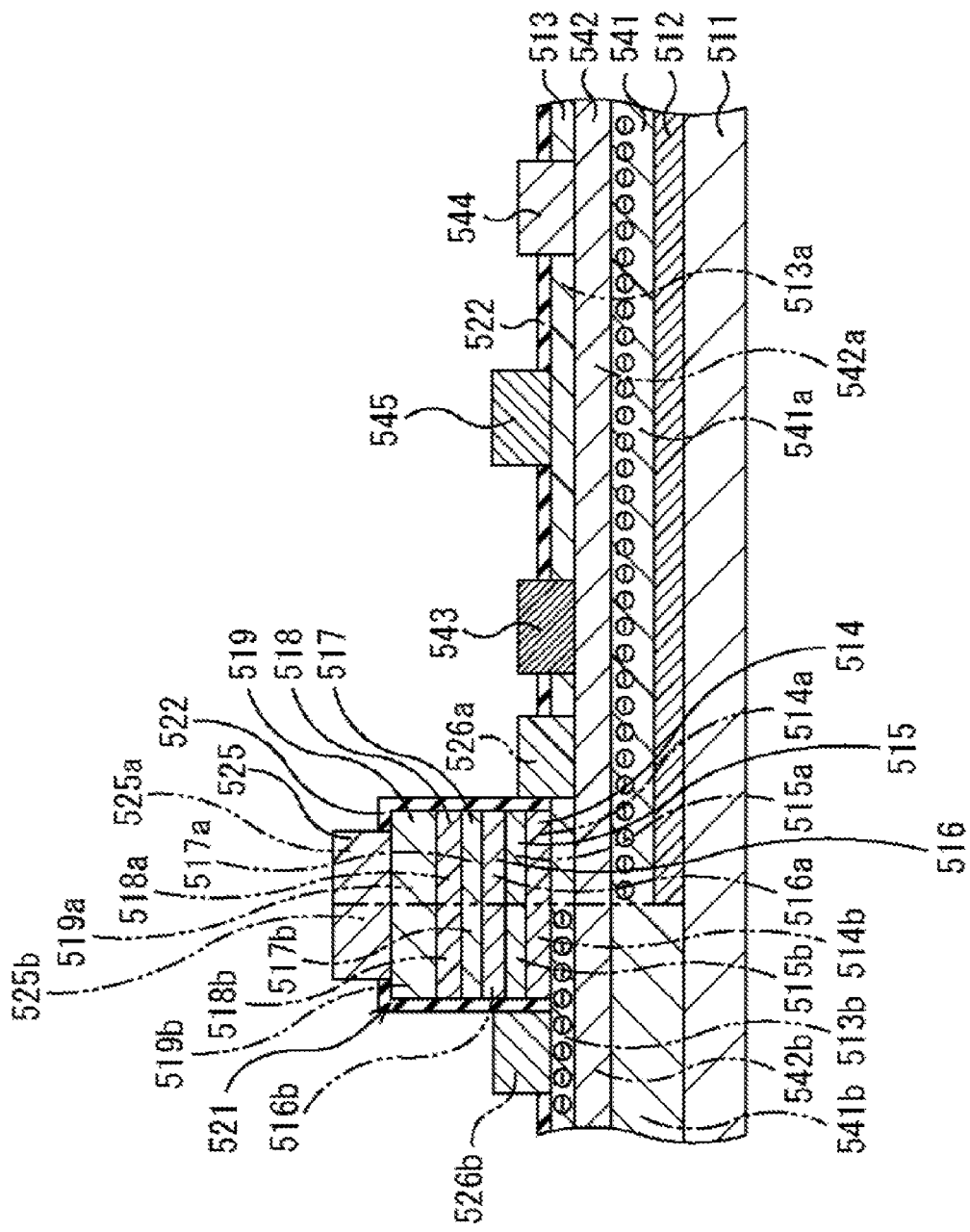
FIG. 8B is a cross-sectional view illustrating the configuration of the compound semiconductor device according to the fifth embodiment.

Next, a fifth embodiment is described. The fifth embodiment is an example compound semiconductor device including a resonant-tunneling diode (RTD) and a high-electron mobility transistor (HEMT). FIG. 8A is a plan view illustrating the configuration of a compound semiconductor device according to the fifth embodiment. FIG. 8B is a cross-sectional view along a line I-I in FIG. 8A.

In the compound semiconductor device according to the fifth embodiment, as illustrated in FIG. 8A and FIG. 8B, a nucleation layer 512 is selectively formed on a substrate 511, and a channel layer 541, an electron supply layer 542, and a cap layer 513 are formed on the nucleation layer 512 and the substrate 511. The channel layer 541 includes a first region 541a having a lower surface in contact with the upper surface of the nucleation layer 512 and a second region 541b having a lower surface in contact with the upper surface of the substrate 511. The electron supply layer 542 includes a first region 542a on the first region 541a and a second region 542b on the second region 541b. The cap layer 513 includes a first region 513a on the first region 542a and a second region 513b on the second region 542b. For example, the substrate 511 is a sapphire substrate having a c-plane as an upper surface, the nucleation layer 512 is an AlN layer, the channel layer 541 is a GaN layer without intentional impurity doping (i-GaN layer), the electron supply layer 542 is an AlGaN layer having an Al content of about 20%, and the cap layer 513 is an n+-GaN layer. The upper surface of the first region 541a is a Ga-polar surface, namely, a (0001) plane in terms of crystal orientation. The upper surface of the second region 541b is an N-polar surface, namely, a (000-1) plane in terms of crystal orientation. The upper surfaces of the first regions 542a and 513a are (0001) planes, and the upper surfaces of the second regions 542b and 513b are (000-1) planes.

On the cap layer 513, a spacer layer 514, a barrier layer 515, a well layer 516, a barrier layer 517, a spacer layer 518, and an emitter contact layer 519 are stacked in a mesa shape. The spacer layer 514, the barrier layer 515, the well layer 516, the barrier layer 517, the spacer layer 518, and the emitter contact layer 519 have the same structures as the spacer layer 114, the barrier layer 115, the well layer 116, the barrier layer 117, the spacer layer 118, and the emitter contact layer 119, respectively. The spacer layer 514 includes a first region 514a on the first region 513a and a second region 514b on the second region 513b. The barrier layer 515 includes a first region 515a on the first region 514a and a second region 515b on the second region 514b. The well layer 516 includes a first region 516a on the first region 515a and a second region 516b on the second region 515b. The barrier layer 517 includes a first region 517a on the first region 516a and a second region 517b on the second region 516b. The spacer layer 518 includes a first region 518a on the first region 517a and a second region 518b on the second region 517b. The emitter contact layer 519 includes a first region 519a on the first region 518a and a second region 519b on the second region 518b. The upper surfaces of the first regions 514a, 515a, 516a, 517a, 518a, and 519a are (0001) planes. The upper surfaces of the second regions 514b, 515b, 516b, 517b, 518b, and 519b are (000-1) planes.

An emitter electrode 525 is formed on the emitter contact layer 519. A recess for a collector electrode is formed in the first region 513a, and a collector electrode 526 is formed in this recess and on the second region 513b. The emitter electrode 525 includes a first region 525a on the first region 519a and a second region 525b on the second region 519b. The collector electrode 526 includes a first region 526a in the recess for a collector electrode and a second region 526b on the second region 513b. The first region 525a and the second region 525b are integrated with and electrically coupled to each other. The first region 526a and the second region 526b are integrated with and electrically coupled to each other. The first region 525a is an example first emitter electrode, and the second region 525b is an example second emitter electrode. The first region 526a is an example first collector electrode, and the second region 526b is an example second collector electrode.

In the fifth embodiment, a recess for a source electrode and a recess for a drain electrode are also formed in the first region 513a. A source electrode 543 is formed in the recess for a source electrode, and a drain electrode 544 is formed in the recess for a drain electrode. A gate electrode 545 is formed on the first region 513a. The gate electrode 545 is positioned between the source electrode 543 and the drain electrode 544 in plane view.

A passivation film 522 is formed to cover portions of the cap layer 513, the spacer layer 514, the barrier layer 515, the well layer 516, the barrier layer 517, the spacer layer 518, and the emitter contact layer 519, the portions being exposed from the emitter electrode 525, the collector electrode 526, the source electrode 543, the drain electrode 544, or the gate electrode 545. The passivation film 522 is, for example, a silicon nitride film.

The compound semiconductor device according to the fifth embodiment includes a double-barrier quantum well structure having a (0001) plane as an upper surface and including the first regions 515a, 516a, and 517a and a double-barrier quantum well structure having a (000-1) plane as an upper surface and including the second regions 515b, 516b, and 517b. Thus, I-V characteristics having good symmetry may be obtained as in the first embodiment.

Since this GaN-based RTD and the GaN-based HEMT including the channel layer 541, the electron supply layer 542, and other layers are integrated on the same substrate 511, a good MOBILE circuit having a small area may be obtained.

In general, when an interface between n+-GaN and AlGaN is present in a region having a (000-1) plane as an upper surface, the conduction band potential is increased by negative fixed charges induced at the interface and increases the ohmic contact resistivity. In contrast, when an interface between n+-GaN and AlGaN is present in a region having a (000-1) plane as an upper surface, the conduction band potential is decreased by positive fixed charges induced at the interface to generate two-dimensional electron gas (2DEG). In the fifth embodiment, the first region 526a of the collector electrode 526, the source electrode 543, and the drain electrode 544 are formed in the recesses of the cap layer 513, and the second region 526b of the collector electrode 526 is formed on the cap layer 513. This configuration may reduce increases in ohmic contact resistivity of the first region 526a, the source electrode 543, and the drain electrode 544 and may keep two-dimensional electron gas under the second region 526b.

Next, a method for manufacturing the compound semiconductor device according to the fifth embodiment is described. FIGS. 9A-9H are cross-sectional views illustrating the process sequence of the method for manufacturing the compound semiconductor device according to the fifth embodiment.

Figure 9A:
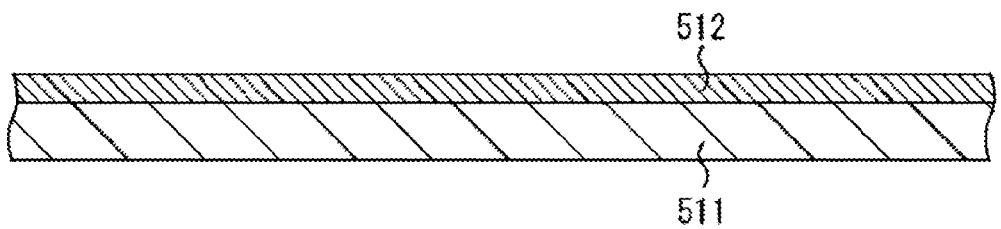
FIGS. 9A to 9H are cross-sectional views sequentially illustrating the steps of a method for manufacturing the compound semiconductor device according to the fifth embodiment.

First, as illustrated in FIG. 9A, a nucleation layer 512 is formed on a substrate 511. For example, a sapphire substrate having a c-plane as an upper surface is used as the substrate 511 and for example, an AlN layer having a thickness of 25 nm is formed as the nucleation layer 512 by a PAMBE method. For example, the temperature of the substrate 511 is 720° C. when the nucleation layer 512 is formed.

Figure 9B:
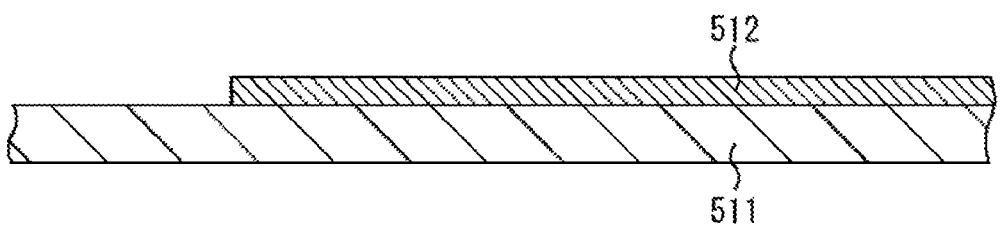

Next, as illustrated in FIG. 9B, a portion of the nucleation layer 512 is removed from a region in which a double-barrier quantum well structure having a (000-1) plane as an upper surface is to be formed. To remove the portion of the nucleation layer 512, a resist pattern that covers a region in which a double-barrier quantum well structure having a (0001) plane as an upper surface is to be formed is formed on the nucleation layer 512, and wet etching using KOH, chlorine-based dry etching, argon-ion milling, or the like is performed by using this resist pattern as a mask. The resist pattern is then removed.

Figure 9C:
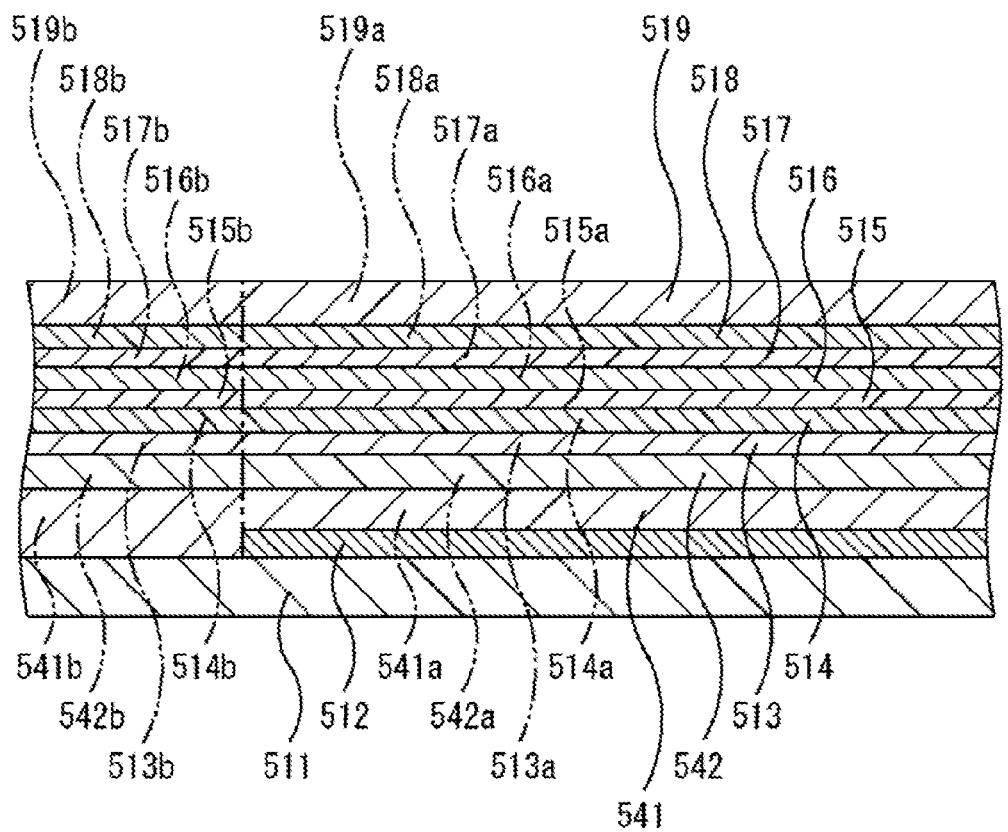

Thereafter, as illustrated in FIG. 9C, a channel layer 541, an electron supply layer 542, a cap layer 513, a spacer layer 514, a barrier layer 515, a well layer 516, a barrier layer 517, a spacer layer 518, and an emitter contact layer 519 are formed on the substrate 511 and the nucleation layer 512. The channel layer 541, the electron supply layer 542, the cap layer 513, the spacer layer 514, the barrier layer 515, the well layer 516, the barrier layer 517, the spacer layer 518, and the emitter contact layer 519 may be formed by, for example, a PAMBE method with a temperature of the substrate 511 of 720° C. As the channel layer 541, for example, an i-GaN layer having a thickness of 1 µm is formed. As the electron supply layer 542, for example, an AlGaN layer having a thickness of 25 nm is formed. As the cap layer 513, for example, an n$^+$-GaN layer having a thickness of 10 nm is formed. The spacer layer 514, the barrier layer 515, the well layer 516, the barrier layer 517, the spacer layer 518, and the emitter contact layer 519 have the same structures as the spacer layer 114, the barrier layer 115, the well layer 116, the barrier layer 117, the spacer layer 118, and the emitter contact layer 119, respectively.

A region of the channel layer 541, the region being grown on the upper surface of the nucleation layer 512, is the first region 541a having a (0001) plane as an upper surface. A region of the channel layer 541, the region being grown on the upper surface of the substrate 511, is the second region 541b having a (000-1) plane as an upper surface. The electron supply layer 542, the cap layer 513, the spacer layer 514, the barrier layer 515, the well layer 516, the barrier layer 517, the spacer layer 518, and the emitter contact layer 519 include the first regions 542a, 513a, 514a, 515a, 516a, 517a, 518a, and 519a grown on the first region 541a, respectively. The electron supply layer 542, the cap layer 513, the spacer layer 514, the barrier layer 515, the well layer 516, the barrier layer 517, the spacer layer 518, and the emitter contact layer 519 include the second regions 542b, 513b, 514b, 515b, 516b, 517b, 518b, and 519b grown on the second region 541b, respectively. In this way, the following structures are formed: a double-barrier quantum well structure having a (0001) plane as an upper surface and including the first regions 515a, 516a, and 517a; and a double-barrier quantum well structure having a (000-1) plane as an upper surface and including the second regions 515b, 516b, and 517b.

Figure 9D:
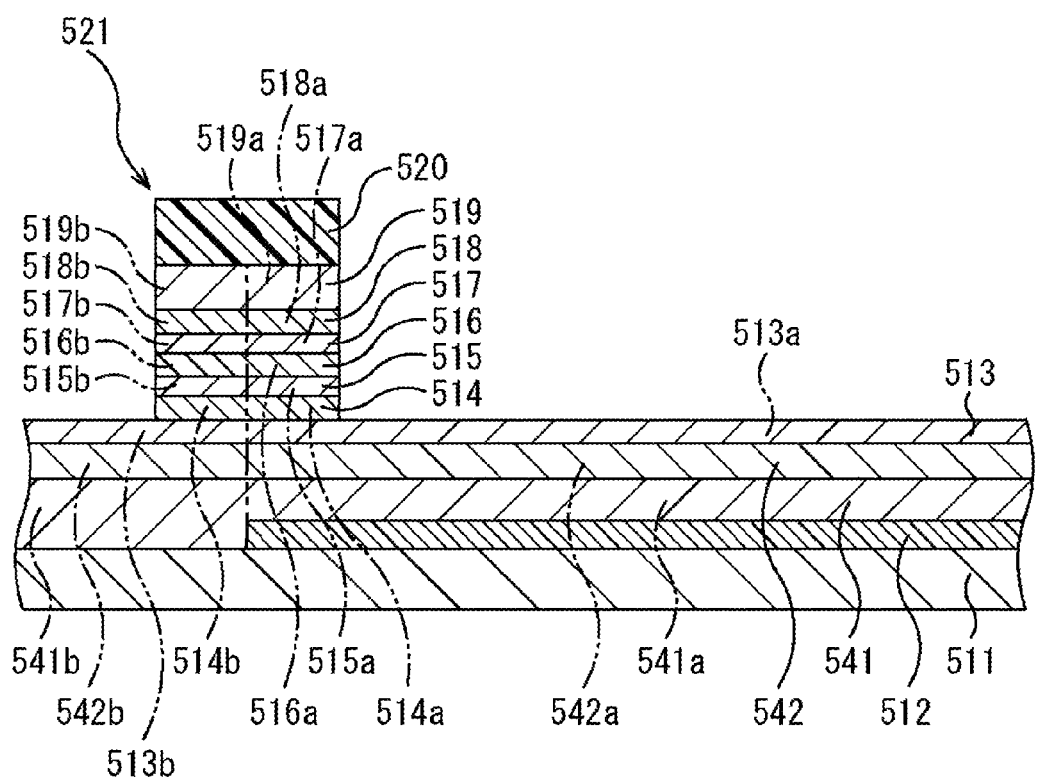

Subsequently, as illustrated in FIG. 9D, a resist pattern 520 that covers portions of the first regions 514a-519a and portions of the second regions 514b-519b is formed on the emitter contact layer 519, and dry etching is performed using the resist pattern 520 as a mask to expose the upper surface of the cap layer 513. As a result, a mesa structure 521 including the spacer layer 514, the barrier layer 515, the well layer 516, the barrier layer 517, the spacer layer 518, and the emitter contact layer 519 is formed. Next, the resist pattern 520 is removed.

Figure 9E:
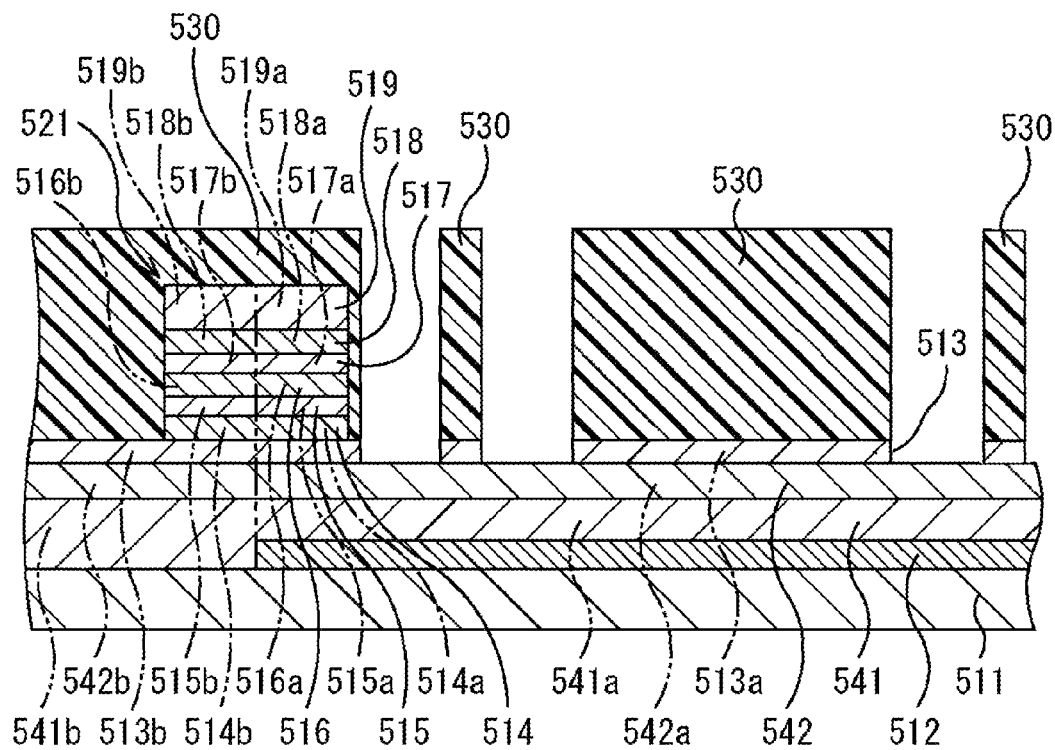

Thereafter, as illustrated in FIG. 9E, a resist pattern 530 for exposing a region in which a first region of a collector electrode is to be formed, a region in which a source electrode is to be formed, and a region in which a drain electrode is to be formed is formed on the emitter contact layer 519 and the cap layer 513. Subsequently, the cap layer 513 is etched by using the resist pattern 530 as a mask to form recesses. Next, the resist pattern 530 is removed.

Figure 9F:
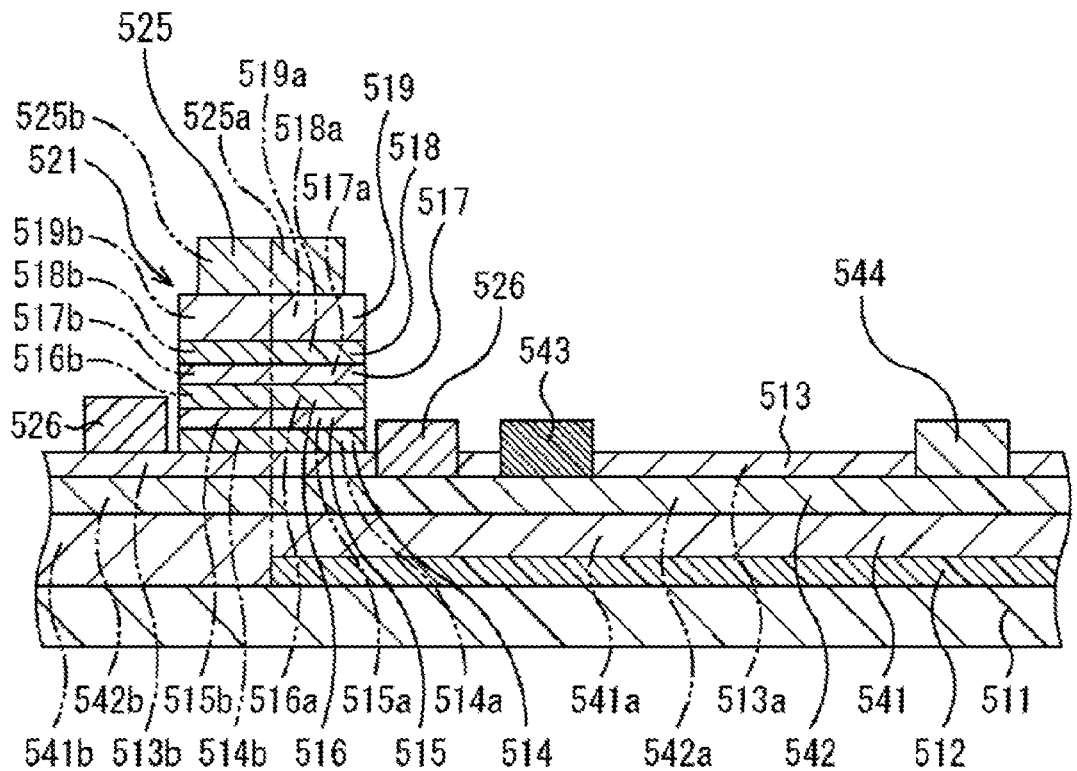

Thereafter, as illustrated in FIG. 9F, an emitter electrode 525, a collector electrode 526, a source electrode 543, and a drain electrode 544 are formed. The emitter electrode 525 is formed on the emitter contact layer 519 in such a manner that the emitter electrode 525 is in contact with both the first region 519a and the second region 519b. The collector electrode 526 is formed in the recess for a collector electrode and on the second region 513b in such a manner that the collector electrode 526 is in contact with both the first region 513a and the second region 513b. The formation of the emitter electrode 525, the collector electrode 526, the source electrode 543, and the drain electrode 544 involves, for example, forming a resist pattern for exposing regions in which these electrodes are to be formed, forming a metal film by a vacuum evaporation method, and removing the resist pattern together with the metal film on the resist pattern. That is, a lift-off method allows portions of the metal film to respectively remain in the regions in which these electrodes are to be formed. To form the metal film, for example, a Ti film is formed and an Al film is formed on the Ti film. After removal of the resist pattern, the metal film is brought into ohmic contact with the cap layer 513 or the emitter contact layer 519 by a heat treatment. As the heat treatment, for example, RTA at about 600° C. is performed.

Figure 9G:
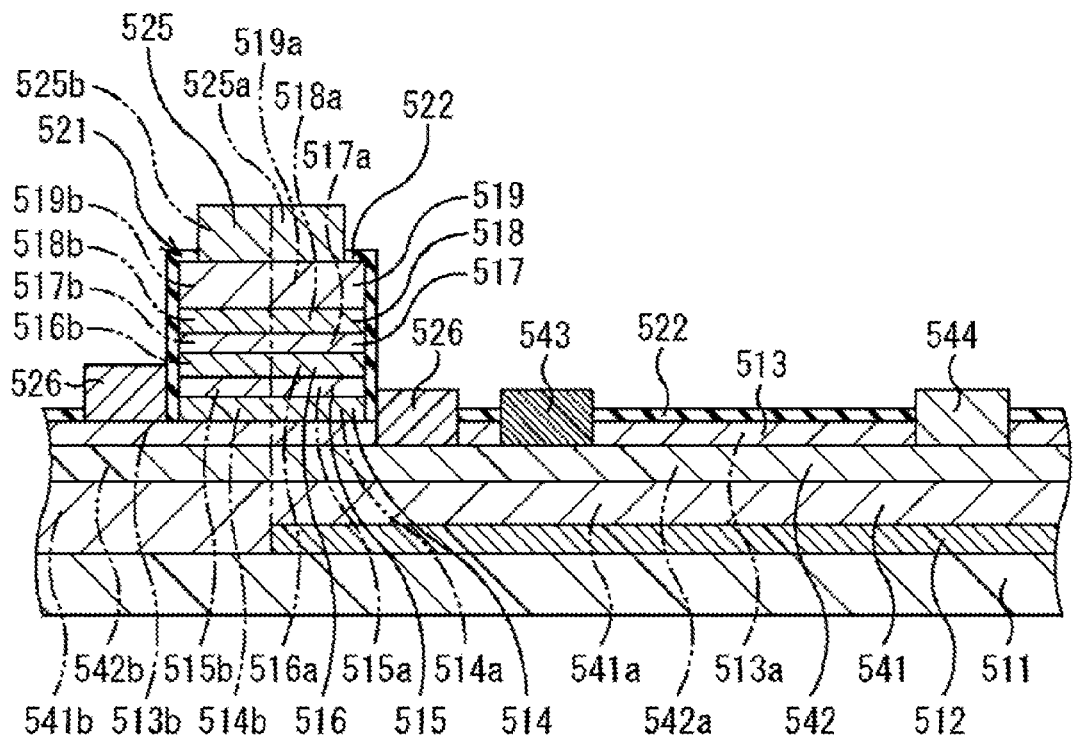

Subsequently, as illustrated in FIG. 9G, a passivation film 522 that covers exposed surfaces of the mesa structure 521 and the cap layer 513 is formed. As the passivation film 522, a silicon nitride film is formed by, for example, a plasma CVD method.

Figure 9H:
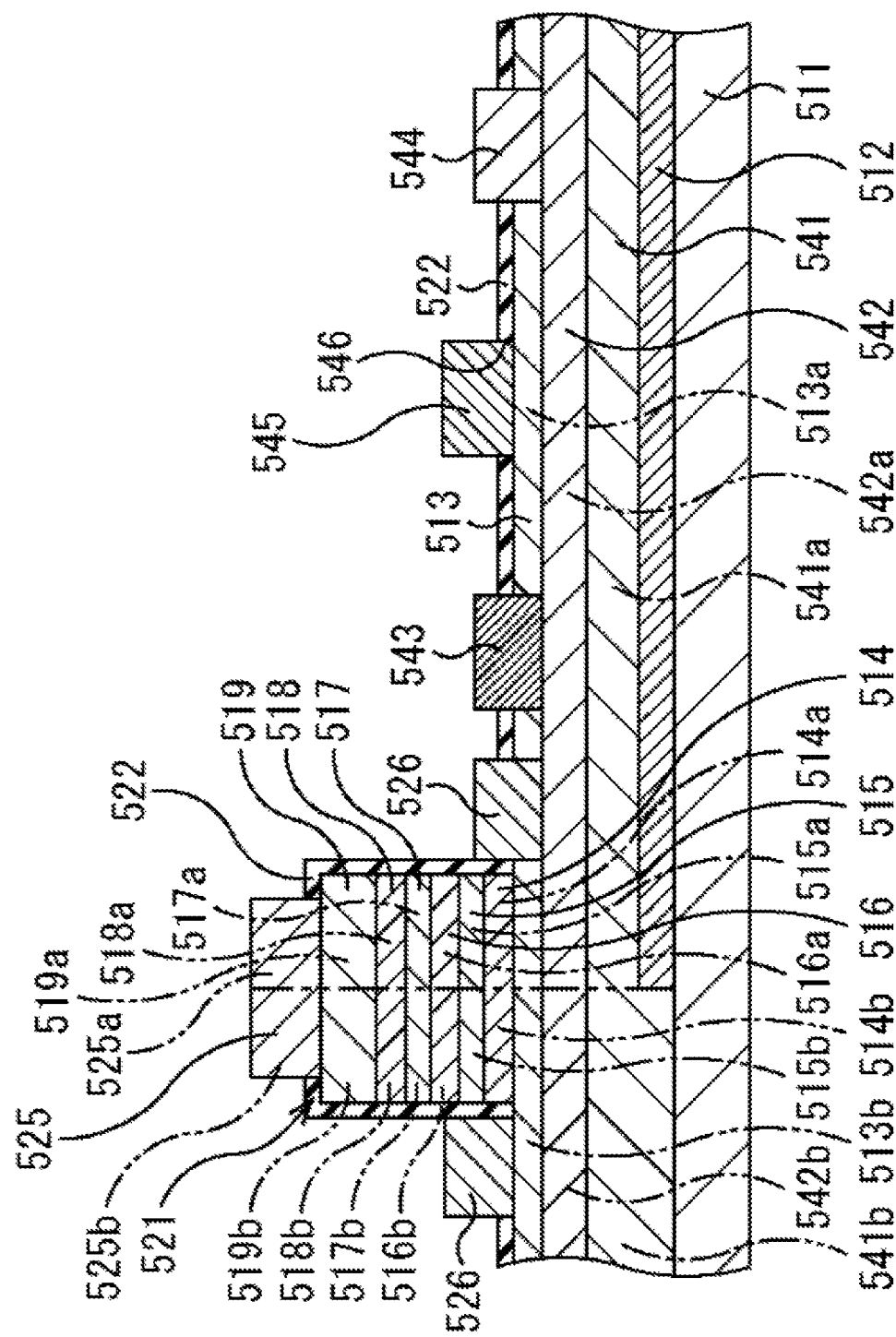

Next, as illustrated in FIG. 9H, a recess 546 is formed in a region of the passivation film 522 in which a gate electrode is to be formed. To form the recesses 546, for example, dry etching using a resist pattern is performed. Then, a gate electrode 545 is formed in the recess 546. The formation of the gate electrode 545 involves, for example, forming a resist pattern for exposing a region in which the gate electrode 545 is to be formed, forming a metal film by a vacuum evaporation method, and removing the resist pattern together with the metal film on the resist pattern. That is, a lift-off method allows a portion of the metal film to remain in the recess 546. To form the metal film, for example, a Ni film is formed and an Au film is formed on the Ni film.

The compound semiconductor device according to the fifth embodiment may be produced accordingly.

Sixth Embodiment

Figure 10:
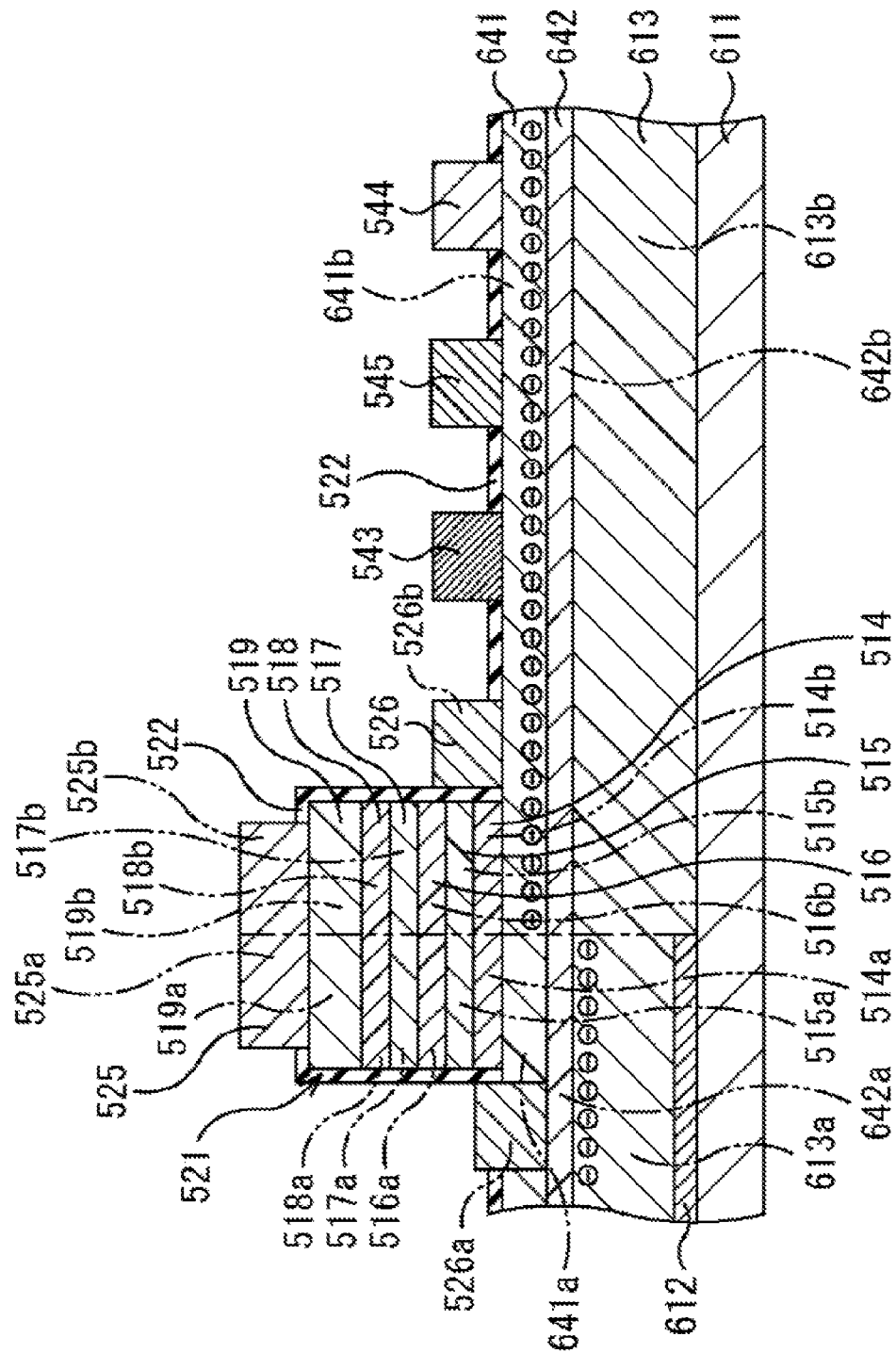
FIG. 10 is a cross-sectional view illustrating the configuration of a compound semiconductor device according to a sixth embodiment.

Next, a sixth embodiment is described. The sixth embodiment is an example compound semiconductor device including a resonant-tunneling diode (RTD) and a high-electron mobility transistor (HEMT). FIG. 10 is a cross-sectional view illustrating the configuration of a compound semiconductor device according to the sixth embodiment.

In the compound semiconductor device according to the sixth embodiment, as illustrated in FIG. 10, a nucleation layer 612 is selectively formed on a substrate 611. A collector contact layer 613, an electron supply layer 642, and a channel layer 641 are formed on the nucleation layer 612 and the substrate 611. The collector contact layer 613 includes a first region 613a having a lower surface in contact with the upper surface of the nucleation layer 612 and a second region 613b having a lower surface in contact with the upper surface of the substrate 611. The electron supply layer 642 includes a first region 642a on the first region 613a and a second region 642b on the second region 613b. The channel layer 641 includes a first region 641a on the first region 642a and a second region 641b on the second region 642b. For example, the substrate 611 is a sapphire substrate having a c-plane as an upper surface, the nucleation layer 612 is an AlN layer, the collector contact layer 613 is a GaN layer, the electron supply layer 642 is an AlGaN layer having an Al content of about 20%, and the channel layer 641 is a GaN layer without intentional impurity doping (i-GaN layer). The upper surface of the first region 613a is a Ga-polar surface, namely, a (0001) plane in terms of crystal orientation. The upper surface of the second region 613b is an N-polar surface, namely, a (000-1) plane in terms of crystal orientation. The upper surfaces of the first regions 642a and 641a are (0001) planes, and the upper surfaces of the second regions 642b and 641b are (000-1) planes.

On the channel layer 641, a spacer layer 514, a barrier layer 515, a well layer 516, a barrier layer 517, a spacer layer 518, and an emitter contact layer 519 are stacked in a mesa shape. The spacer layer 514, the barrier layer 515, the well layer 516, the barrier layer 517, the spacer layer 518, and the emitter contact layer 519 have the same structures as the spacer layer 114, the barrier layer 115, the well layer 116, the barrier layer 117, the spacer layer 118, and the emitter contact layer 119, respectively. The spacer layer 514 includes a first region 514a on the first region 641a and a second region 514b on the second region 614b. The barrier layer 515 includes a first region 515a on the first region 514a and a second region 515b on the second region 514b. The well layer 516 includes a first region 516a on the first region 515a and a second region 516b on the second region 515b. The barrier layer 517 includes a first region 517a on the first region 516a and a second region 517b on the second region 516b. The spacer layer 518 includes a first region 518a on the first region 517a and a second region 518b on the second region 517b. The emitter contact layer 519 includes a first region 519a on the first region 518a and a second region 519b on the second region 518b. The upper surfaces of the first regions 514a, 515a, 516a, 517a, 518a, and 519a are (0001) planes. The upper surfaces of the second regions 514b, 515b, 516b, 517b, 518b, and 519b are (000-1) planes.

An emitter electrode 525 is formed on the emitter contact layer 519. A recess for a collector electrode is formed in the second region 641b, and a collector electrode 526 is formed in this recess and on the first region 641a. The emitter electrode 525 includes a first region 525a on the first region 519a and a second region 525b on the second region 519b. The collector electrode 526 includes a first region 526a in the recess for a collector electrode and the second region 526b on the second region 641b. The first region 525a and the second region 525b are integrated with and electrically coupled to each other. The first region 526a and the second region 526b are integrated with and electrically coupled to each other.

In the sixth embodiment, a source electrode 543, a drain electrode 544, and a gate electrode 545 are formed on the second region 641b. The gate electrode 545 is positioned between the source electrode 543 and the drain electrode 544 in plane view.

A passivation film 522 is formed to cover portions of the channel layer 641, the spacer layer 514, the barrier layer 515, the well layer 516, the barrier layer 517, the spacer layer 518, and the emitter contact layer 519, the portions being exposed from the emitter electrode 525, the collector electrode 526, the source electrode 543, the drain electrode 544, or the gate electrode 545. The passivation film 522 is, for example, a silicon nitride film.

The compound semiconductor device according to the sixth embodiment includes a double-barrier quantum well structure having a (0001) plane as an upper surface and including the first regions 515a, 516a, and 517a and a double-barrier quantum well structure having a (000-1) plane as an upper surface and including the second regions 515b, 516b, and 517b. Thus, I-V characteristics having good symmetry may be obtained as in the first embodiment.

Since this GaN-based RTD and the GaN-based HEMT including the channel layer 641, the electron supply layer 642, and other layers are integrated on the same substrate 611, a good MOBILE circuit having a small area may be obtained.

Furthermore, an increase in ohmic contact resistivity of the first region 526a of the collector electrode 526 may be reduced and two-dimensional electron gas may be kept under the second region 526b of the collector electrode 526, the source electrode 543, and the drain electrode 544.

In both the fifth embodiment and the sixth embodiment, the collector electrode 526 may have a framed-rectangle plane. In the RTD part, the first regions and the second regions included in the spacer layer 514, the barrier layer 515, the well layer 516, the barrier layer 517, the spacer layer 518, the emitter contact layer 519, the emitter electrode 525, and the collector electrode 526 preferably have planes substantially line-symmetric to each other with respect to the boundary between the first regions and the second regions. The first region 525a and the second region 525b may not be integrated with each other as long as the first region 525a and the second region 525b are electrically coupled to each other. The first region 526a and the second region 526b may not be integrated with each other as long as the first region 526a and the second region 526b are electrically coupled to each other. The configuration in the fifth embodiment or the sixth embodiment may be combined with the configuration as in the second embodiment, the third embodiment, or the fourth embodiment.

The combination of a material of the well layer and a material of the barrier layer is not limited to the combination of GaN and AlN as long as the band gap of the well layer is smaller than that of the barrier layer. For example, the barrier layer may include an $In_xAl_yGa_{1-x-y}N$ (0≤x<1, 0≤y<1, 0<x+y<1) layer, and the well layer may include an $In_zGa_{1-z}N$ (0≤z<1) layer. More specifically, the barrier layer may contain AlGaN, InAlN, or InAlGaN, and the well layer may contain InGaN.

Seventh Embodiment

Figure 11:
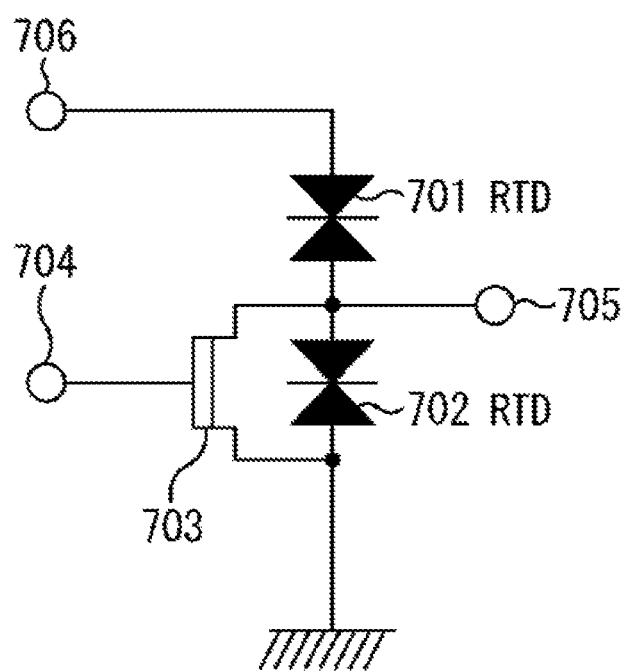
FIG. 11 is an electrical diagram illustrating the configuration of a logic circuit according to a seventh embodiment.

Next, a seventh embodiment is described. The seventh embodiment is an example high-speed logic gate MOBILE circuit. FIG. 11 is an electrical diagram illustrating the configuration of a logic circuit according to the seventh embodiment.

The logic circuit according to the seventh embodiment includes an RTD 701, an RTD 702, and a switch element 703. The switch element 703 is, for example, a HEMT. The RTD 702 is connected in parallel to the switch element 703 and connected in series to one end of the RTD 701. The other end of the RTD 701 is connected to a clock terminal 706 that receives a clock signal, and the RTD 702 is grounded. A control terminal (gate terminal) of the switch element 703 corresponds to an input terminal 704, and an output terminal 705 is connected between the RTD 701 and the RTD 702. For example, the GaN-based RTD in the fifth or sixth embodiment is used as the RTD 701 and the RTD 702. For example, the GaN-based HEMT in the fifth or sixth embodiment is used as the switch element 703.

A GaN-based HEMT enables high current operation with a smaller size than an InP-based HEMT. Therefore, according to the seventh embodiment, a logic circuit may be downsized (integrated) to provide a compact, high-capacity core communication network system.

Eighth Embodiment

Figure 12:
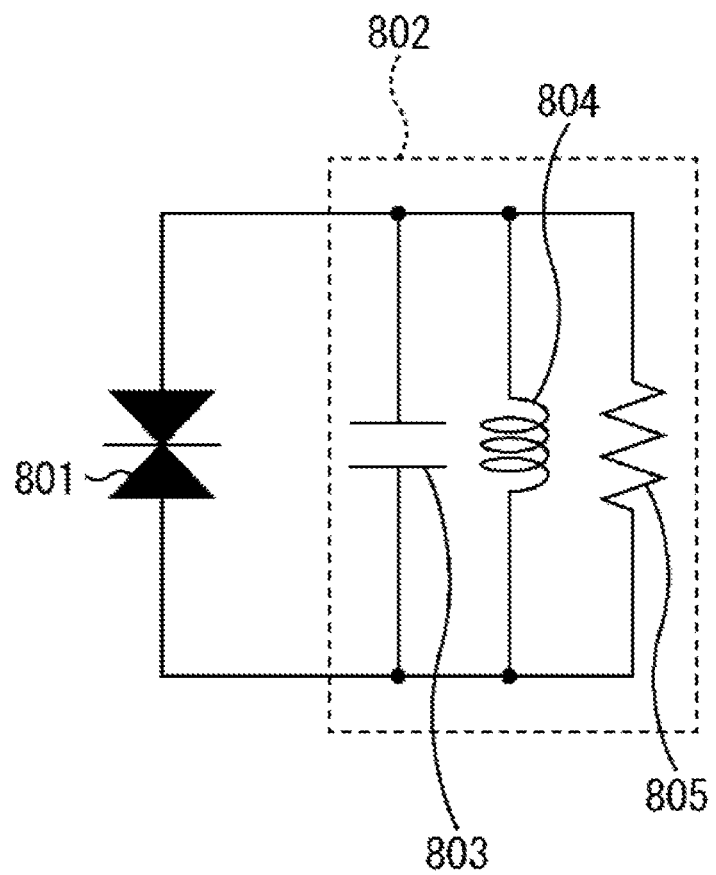
FIG. 12 is an electrical diagram illustrating the configuration of an oscillator according to an eighth embodiment.

Next, an eighth embodiment is described. The eighth embodiment is an example oscillator. FIG. 12 is an electrical diagram illustrating the configuration of an oscillator according to the eighth embodiment.

The oscillator according to the eighth embodiment includes an RTD 801 and an antenna 802. The antenna 802 includes a capacitive element 803, an inductor 804, and a resistive element 805. For example, the GaN-based RTD in the first, second, third, or fourth embodiment is used as the RTD 801.

In this oscillator, the RTD 801 generates electric oscillations and emits terahertz waves through the antenna 802. According to the eighth embodiment, a compact, ultra-high-speed, high-capacity wireless network system may be obtained.

Ninth Embodiment

Figure 13:
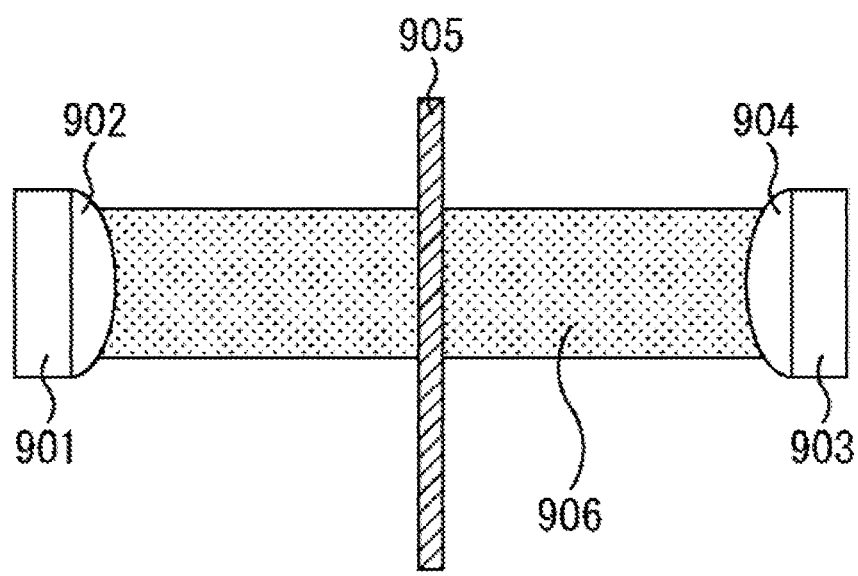
FIG. 13 is a cross-sectional view illustrating the configuration of a sensor according to a ninth embodiment.

Next, a ninth embodiment is described. The ninth embodiment is an example imaging sensor. FIG. 13 is a cross-sectional view illustrating the configuration of a sensor according to the ninth embodiment.

The sensor according to the ninth embodiment includes an oscillator 901, a lens 902, a detector 903, and a lens 904. The lens 902 is fixed to an oscillating surface of the oscillator 901, and the lens 904 is fixed to a detecting surface of the detector 903. The oscillator 901 and the detector 903 have the same configuration as the oscillator according to the eighth embodiment.

In this sensor, terahertz waves 906 emitted from the oscillator 901 are detected by the detector 903. When an object 905 exists between the oscillator 901 and the detector 903, the inside of the object 905 may be inspected. This sensor may be used for, for example, inspection of drugs, hazardous materials, explosive materials, and the like. This sensor may also be used for environmental sensing, such as global-warming monitoring. According to the ninth embodiment, a sensing network system that provides safety and security may be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device comprising:
a substrate;
a nitride semiconductor layer formed over the substrate;
a first barrier layer of a nitride semiconductor formed over the substrate a part of a first region of the nitride semiconductor layer;
a first collector electrode formed over another part of the first region of the nitride semiconductor layer;
a first well layer of a nitride semiconductor formed over the first barrier layer;
a second barrier layer of a nitride semiconductor formed over the first well layer;
a first emitter electrode formed over the second barrier layer;
a third barrier layer of a nitride semiconductor formed over a part of a second region of the nitride semiconductor layer, the second region is adjacent to the first region;
a second collector electrode formed over another part of the second region of the nitride semiconductor layer;
a second well layer of a nitride semiconductor formed over the third barrier layer;
a fourth barrier layer of a nitride semiconductor formed over the second well layer; and
a second emitter electrode formed over the fourth barrier layer, wherein
an upper surface of the first region of the nitride semiconductor layer, an upper surface of the first barrier layer, an upper surface of the first well layer, and an upper surface of the second barrier layer have a (0001) plane in terms of crystal orientation,
an upper surface of the second region of the nitride semiconductor layer, an upper surface of the third barrier layer, an upper surface of the second well layer, and an upper surface of the fourth barrier layer have a (000-1) plane in terms of crystal orientation,
the first emitter electrode and the second emitter electrode are electrically coupled to each other, and
the first collector electrode and the second collector electrode are electrically coupled to each other.

2. The compound semiconductor device according to claim 1,
wherein the first barrier layer, the second barrier layer, the third barrier layer and the second barrier layer each include an $In_xAl_yGa_{1-x-y}N$ ($0 \leq x < 1$, $0 \leq y < 1$, $0 < x+y < 1$) layer, and
the first well layer and second well layer each includes an $In_zGa_{1-z}N$ ($0 \leq z < 1$) layer.

3. The compound semiconductor device according to claim 1,
wherein an ion-implanted region is formed at a boundary between the first and the third barrier layers, between the first and the second well layers, and between the second and the fourth barrier layers.

4. The compound semiconductor device according to claim 1,
wherein a passivation film is formed at a boundary between the first and the third barrier layers, between the first and the second well layers, and between the second and the fourth barrier layers.

5. The compound semiconductor device according to claim 1,
wherein the substrate is a sapphire substrate, a silicon carbide substrate, a gallium nitride substrate, or an aluminum nitride substrate.

6. The compound semiconductor device according to claim 1,
wherein the first emitter electrode and the second emitter electrode are integrated with each other, and
the first collector electrode and the second collector electrode are integrated with each other.

7. The compound semiconductor device according to claim 1, further comprising:
a high-electron mobility transistor formed on the substrate.

* * * * *